(12) United States Patent
Kwak et al.

(10) Patent No.: US 10,233,542 B2
(45) Date of Patent: *Mar. 19, 2019

(54) APPARATUS FOR TREATING SUBSTRATE AND METHOD FOR TREATING SUBSTRATE

(71) Applicant: JUSUNG ENGINEERING CO., LTD., Gwangju-si, Gyeonggi-do (KR)

(72) Inventors: Jae Chan Kwak, Yongin-si (KR); Sung Kyu Kang, Gwangju-si (KR); Hun Jung, Gwangju-si (KR); Byoung Ha Cho, Daejeon (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/411,477

(22) PCT Filed: Jun. 26, 2013

(86) PCT No.: PCT/KR2013/005647
§ 371 (c)(1),
(2) Date: Dec. 26, 2014

(87) PCT Pub. No.: WO2014/003434
PCT Pub. Date: Jan. 3, 2014

(65) Prior Publication Data
US 2015/0337441 A1  Nov. 26, 2015

(30) Foreign Application Priority Data

Jun. 29, 2012 (KR) .................. 10-2012-0070881
Jun. 20, 2013 (KR) .................. 10-2013-0071129

(51) Int. Cl.
*H01J 37/32*  (2006.01)
*C23C 16/455*  (2006.01)
*H01L 21/687*  (2006.01)

(52) U.S. Cl.
CPC .. *C23C 16/45544* (2013.01); *C23C 16/45536* (2013.01); *C23C 16/45551* (2013.01);
(Continued)

(58) Field of Classification Search
None
See application file for complete search history.

(56) References Cited

U.S. PATENT DOCUMENTS 5,149,375 A * 9/1992 Matsuyama .......... C23C 16/452
                                                    118/719
5,651,867 A * 7/1997 Kokaku ................ C23C 14/566
                                                    118/719

(Continued)

FOREIGN PATENT DOCUMENTS

CN    1847450 A    10/2006
CN    101451237 A   6/2009
(Continued)

*Primary Examiner* — Karla A Moore
(74) *Attorney, Agent, or Firm* — Renaissance IP Law Group LLP

(57) ABSTRACT

Disclosed is a substrate processing apparatus and method which facilitates to sequentially or repetitively carry out a thin film deposition process and a surface treatment process inside one process space, wherein the substrate processing apparatus comprises a process chamber for providing a process space; a substrate supporter for supporting at least one of substrates and moving the supported substrate in a predetermined direction; a chamber lid confronting the substrate supporter; and a gas distributor for spatially separating process gas for depositing a thin film on the substrate from a surface treatment gas for performing a surface treatment of the thin film, and locally distributing the process gas and the surface treatment gas on the substrate supporter, wherein the gas distributor confronting the substrate supporter is provided in the chamber lid.

5 Claims, 12 Drawing Sheets

(52) U.S. Cl.
CPC .... *H01J 37/3244* (2013.01); *H01J 37/32449* (2013.01); *H01J 37/32733* (2013.01); *H01L 21/68764* (2013.01); *H01L 21/68771* (2013.01)

(56) References Cited

U.S. PATENT DOCUMENTS

| | | | |
|---|---|---|---|
| 7,435,445 B2* | 10/2008 | Shin | C23C 16/452 118/715 |
| 9,387,510 B2* | 7/2016 | Huh | H01J 37/32366 |
| 2001/0007244 A1 | 7/2001 | Matsuse | |
| 2003/0106643 A1 | 6/2003 | Tabuchi et al. | |
| 2003/0194493 A1 | 10/2003 | Chang et al. | |
| 2006/0177579 A1 | 8/2006 | Shin et al. | |
| 2010/0037820 A1* | 2/2010 | Lee | C23C 16/45551 118/719 |
| 2010/0190341 A1 | 7/2010 | Park et al. | |
| 2015/0111391 A1* | 4/2015 | Hwang | C23C 16/45551 438/758 |

FOREIGN PATENT DOCUMENTS

| | | |
|---|---|---|
| JP | 2004128417 A | 4/2004 |
| JP | 2005174879 A | 6/2005 |
| JP | 2010239103 A | 10/2010 |
| KR | 100552378 | 2/2006 |
| KR | 20060055822 A | 5/2006 |
| KR | 20090008799 A | 1/2009 |
| KR | 20090103441 A | 10/2009 |
| KR | 20110110749 A | 10/2011 |
| KR | 20120029797 A | 3/2012 |

* cited by examiner

APPARATUS FOR TREATING SUBSTRATE AND METHOD FOR TREATING SUBSTRATE

CROSS REFERENCE TO RELATED APPLICATIONS

This application claims the benefit of the Korean Patent Application Nos. 10-2012-0070881 filed on Jun. 29, 2012, and 10-2013-0071129 filed on Jun. 20, 2013, which are hereby incorporated by reference as if fully set forth herein.

BACKGROUND

Field of the Invention

The present invention relates to an apparatus and method of processing substrate which deposits a thin film on a substrate.

Discussion of the Related Art

Generally, in order to manufacture a solar cell, a semiconductor device and a flat panel display device, it is necessary to form a predetermined thin film layer, a thin film circuit pattern or an optical pattern on a surface of a substrate. To this end, a semiconductor manufacturing process may be carried out, for example, a thin film deposition process of depositing a thin film of a predetermined material on a substrate, a photo process of selectively exposing the thin film by the use of photosensitive material, and an etching process of forming a pattern by selectively removing an exposed portion of the thin film.

The semiconductor manufacturing process is performed inside a substrate processing apparatus designed to be suitable for optimal circumstances. Recently, a substrate processing apparatus using plasma is generally used to carry out a deposition or etching process.

This semiconductor manufacturing process using plasma may be a PECVD (Plasma Enhanced Chemical Vapor Deposition) apparatus for forming a thin film, and a plasma etching apparatus for etching and patterning the thin film.

FIG. 1 illustrates a substrate processing apparatus according to the related art.

Referring to FIG. 1, the substrate processing apparatus according to the related art may include a chamber 10, a plasma electrode 20, a susceptor 30, and a gas distributing means 40.

The chamber 10 provides a process space for substrate processing. In this case, a predetermined portion of a bottom surface of the chamber 10 is communicated with an exhaust pipe 12 for discharging gas from the process space.

The plasma electrode 20 is provided on the chamber 10 so as to seal the process space.

One side of the plasma electrode 20 is electrically connected with a RF (Radio Frequency) power source 24 through a matching member 22. The RF power source 24 generates RF power, and supplies the generated RF power to the plasma electrode 20.

Also, a central portion of the plasma electrode 20 is communicated with a gas supply pipe 26 of supplying process gas for the substrate processing.

The matching member 22 is connected between the plasma electrode 20 and the RF power source 24, to thereby match load impedance and source impedance of the RF power supplied from the RF power source 24 to the plasma electrode 20.

The susceptor 30 is provided inside the chamber 10, and the susceptor 30 supports a plurality of substrates (W) loaded from the external. The susceptor 30 functions as an opposite electrode (or ground electrode) in opposite to the plasma electrode 20.

The gas distributing means 40 is provided below the plasma electrode 20, wherein the gas distributing means 40 is provided to confront the susceptor 30. In this case, a gas diffusion space 42 is formed between the gas distributing means 40 and the plasma electrode 20. Inside the gas diffusion space 42, the process gas supplied from the gas supply pipe 26 penetrating through the plasma electrode 20 is diffused. The gas distributing means 40 uniformly distributes the process gas to the entire area of the process space through a plurality of gas distributing holes 14 being communicated with the gas diffusion space 42.

In case of the substrate processing apparatus according to the related art, after the substrate (W) is loaded onto the susceptor 30, the predetermined process gas is distributed to the process space of the chamber 10, and the RF power is supplied to the plasma electrode 20 so as to form the plasma, to thereby deposit a predetermined thin film on the substrate (W).

However, the substrate processing apparatus according to the related art may have the following problems.

First, there exist foreign matters in the surface and the inside of the thin film deposited on the substrate (W) by the thin film deposition process, thereby deteriorating the quality of thin film.

Also, the substrate (W) provided with the thin film deposited thereon has to be transferred to an additional surface-treatment chamber so as to carry out a surface treatment (or removing process of foreign matters) process for improving the quality of thin film, thereby increasing the manufacturing cost.

SUMMARY

Accordingly, the present invention is directed to an apparatus and method of processing substrate that substantially obviates one or more problems due to limitations and disadvantages of the related art.

An aspect of the present invention is to provide an apparatus and method of processing substrate, which enables to sequentially or repetitively perform a thin film deposition process and a surface treatment process inside on process space.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a substrate processing apparatus that may include a process chamber for providing a process space; a substrate supporter for supporting at least one of substrates and moving the supported substrate in a predetermined direction, wherein the substrate supporter is provided inside the process chamber; a chamber lid confronting the substrate supporter, the chamber lid for covering an upper side of the process chamber; and a gas distributor for spatially separating process gas for depositing a thin film on the substrate from a surface treatment gas for performing a surface treatment of the thin film, and locally distributing the process gas and the surface treatment gas on the substrate supporter, wherein the gas distributor confronting the substrate supporter is provided in the chamber lid.

In another aspect of the present invention, there is provided a substrate processing method that may include loading at least one substrate on a substrate supporter provided inside a process space of a process chamber; moving the substrate by driving the substrate supporter; and spatially separating process gas for depositing a thin film on the substrate from surface treatment gas for a surface treatment of the thin film inside the process space, and distributing the process gas and the surface treatment gas on the moving substrate.

At this time, the process gas may contain the source gas and reactant gas to form the thin film, and the surface treatment gas may be activated by plasma, and then distributed to the area arranged in-between each of source gas distribution area and reactant gas distribution area. The surface treatment gas may be argon gas or helium gas.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

On explanation about the embodiments of the present invention, the following details about the terms should be understood.

The term of a singular expression should be understood to include a multiple expression as well as the singular expression if there is no specific definition in the context. If using the term such as "the first" or "the second", it is to separate any one element from other elements. Thus, a scope of claims is not limited by these terms.

Also, it should be understood that the term such as "include" or "have" does not preclude existence or possibility of one or more features, numbers, steps, operations, elements, parts or their combinations.

It should be understood that the term "at least one" includes all combinations related with any one item. For example, "at least one among a first element, a second element and a third element" may include all combinations of the two or more elements selected from the first, second and third elements as well as each element of the first, second and third elements.

Also, if it is mentioned that a first element is positioned "on" a second element, it should be understood that the first element is formed "just above" the second element while being in contact with the second element, and furthermore a third element is interposed between the first and second elements.

Hereinafter, embodiments of the present invention will be described in detail with reference to the accompanying drawings.

Figure 1:
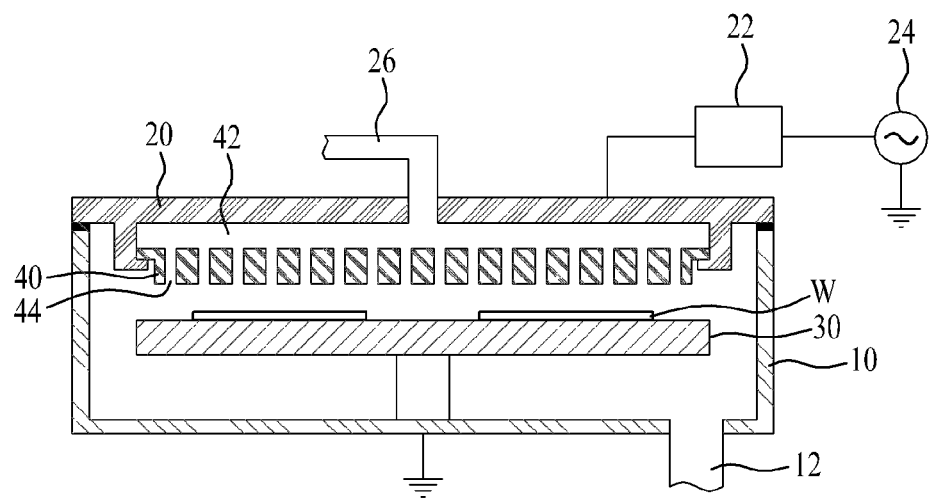
FIG. 1 illustrates a substrate processing apparatus according to the related art.
Figure 2:
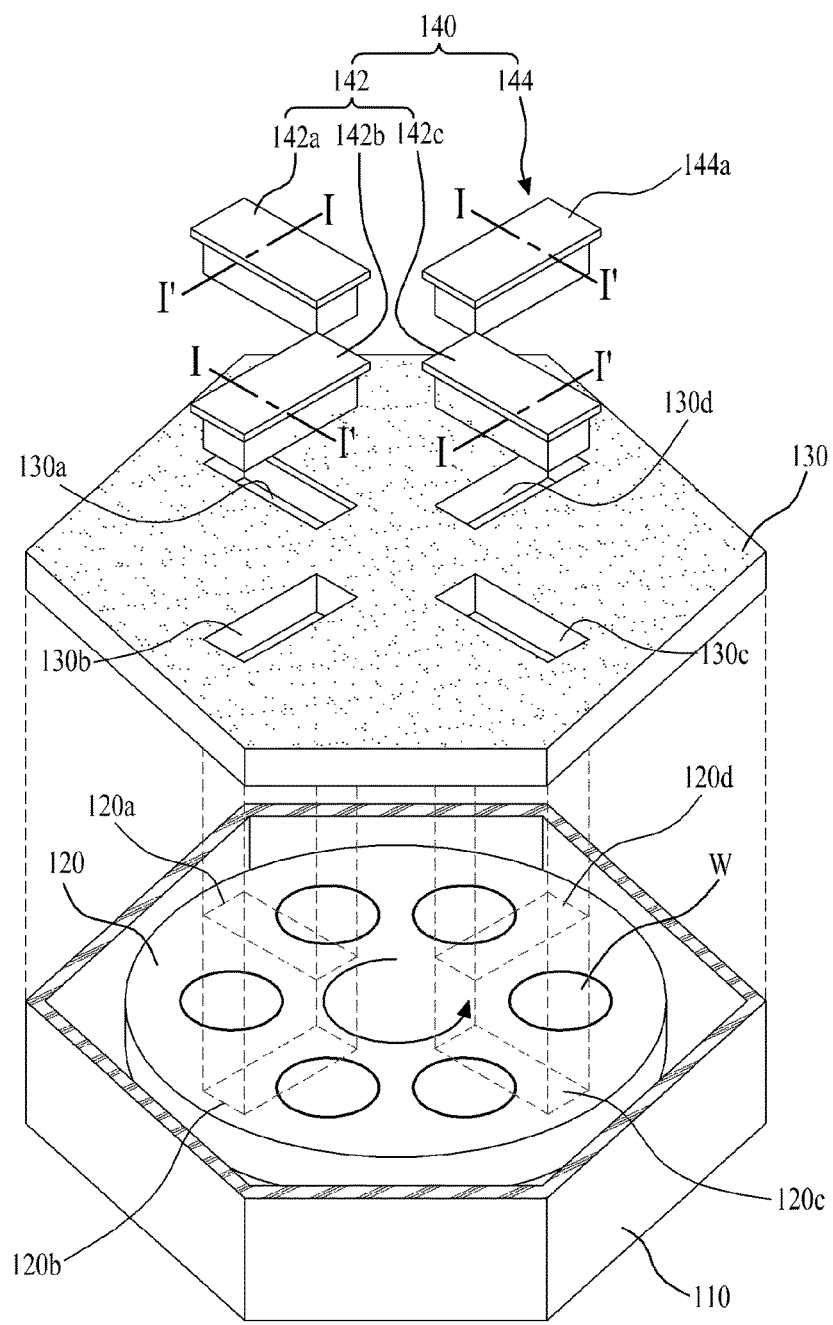
FIG. 2 is a perspective view illustrating a substrate processing apparatus according to the first embodiment of the present invention.
Figure 3:
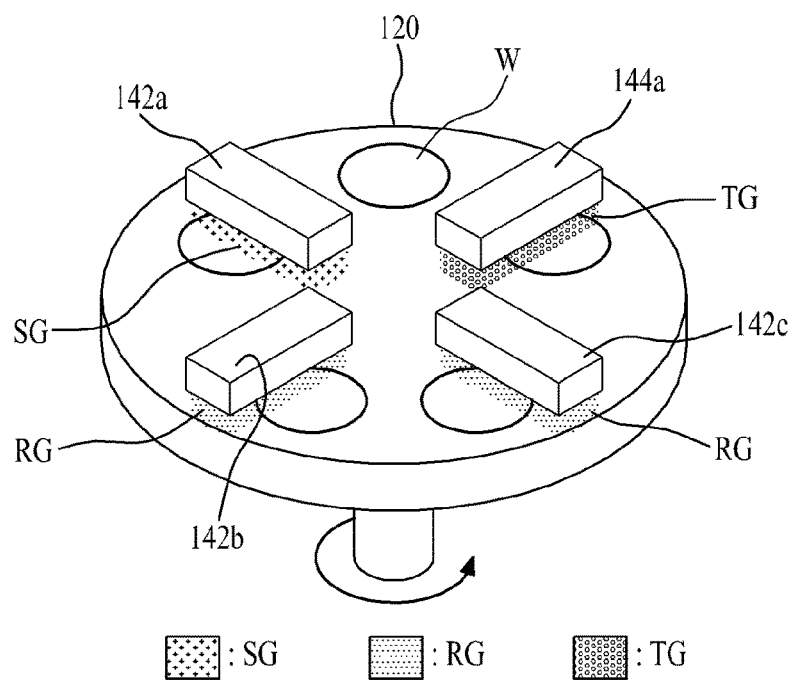
FIG. 3 is a concept view illustrating an arrangement structure of a gas distributor shown in FIG. 2.
Figure 4:
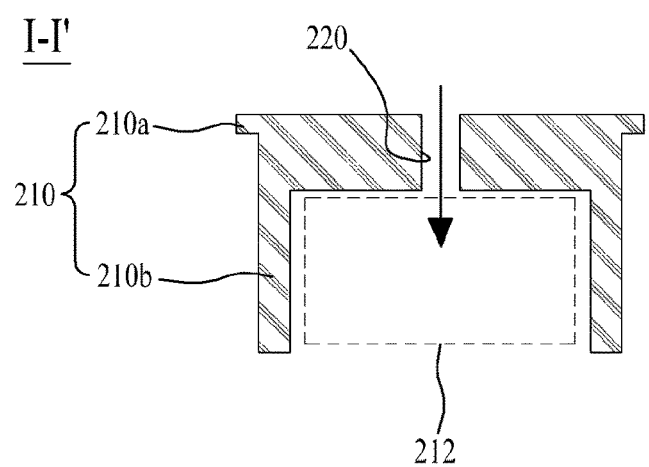
FIG. 4 is a cross sectional view illustrating a gas distribution module shown in FIG. 3.

FIG. 2 is a perspective view illustrating a substrate processing apparatus according to the first embodiment of the present invention. FIG. 3 is a concept view illustrating an arrangement structure of a gas distributor shown in FIG. 2. FIG. 4 is a cross sectional view illustrating a gas distribution module shown in FIG. 3.

Referring to FIGS. 2 to 4, the substrate processing apparatus according to the first embodiment of the present invention may include a process chamber 110 for providing a process space; a substrate supporter 120 provided on the bottom of the process chamber 110, wherein the substrate supporter 120 supports at least one substrate (W) thereon; a chamber lid 130 for covering an upper side of the process chamber 110; and a gas distributor 140 for carrying out a thin film deposition process for depositing a thin film on the substrate (W) inside the process space, and a surface treatment process for the thin film deposited on the substrate (W), wherein the gas distributor 140 confronting the chamber lid 130 is provided in the chamber lid 130.

The process chamber 110 provides the process space for substrate processing, for example, the thin film deposition process. A bottom surface and/or a lateral surface of the process chamber 110 may be communicated with an exhaust port (not shown) for discharging gas from the process space.

The substrate supporter 120 is rotatably provided in the inner bottom of the process chamber 110. The substrate supporter 120 is supported by a driving axis (not shown) penetrating through a central portion of the bottom surface of the process chamber 110, and the substrate supporter 120 may be electrically floating or grounded, or may have an electric potential. In this case, the driving axis exposed out of the bottom surface of the process chamber 100 is sealed by a bellows (not shown) provided in the bottom surface of the process chamber 110.

The substrate supporter 120 supports at least one substrate (W) loaded by an external substrate loading apparatus (not shown). The substrate supporter 120 may be formed in shape of a circular plate. The substrate (W) may be a semiconductor substrate or a wafer. In this case, it is preferable that the plurality of substrates (W) be arranged at fixed intervals in a circular pattern on the substrate supporter 120 so as to improve the yield of substrate processing.

According as the substrate supporter 120 is rotated to a predetermined direction (for example, counterclockwise direction) by rotation of the driving axis, the substrate (W) moves. Thus, process gas and surface treatment gas (TG), locally distributed from the gas distributor 140, reach each substrate (W) so that a predetermined thin film is deposited on an upper surface of the substrate (W) by ALD (Atomic Layer Deposition) process using the process gas, and foreign matters of the thin film deposited on the substrate (W) are removed by the use of surface treatment process using the surface treatment gas (TG). As a result, the substrate supporter 120 moves the substrate (W) in the process space so that the above ALD process and the surface treatment process are sequentially (or successively) carried out thereon.

The chamber lid 130 is provided on the process chamber 110, that is, the chamber lid 130 covers the upper side of the process chamber 110, to thereby seal the process space.

As shown in FIG. 2, the process chamber 110 and the chamber lid 130 are formed in shape of hexagon. However, the process chamber 110 and the chamber lid 130 may be formed in various shapes, for example, polygonal shape, elliptical shape, or circular shape. If the process chamber 110 and the chamber lid 130 are formed in the polygonal shape, the process chamber 110 and the chamber lid 130 are provided in such a structure that they are divided into a plurality of sections, and the divided sections are combined with one another.

The chamber lid 130 includes a plurality of module receivers 130a, 130b, 130c and 130d provided at fixed intervals, for example, a radial pattern, and each part of the gas distributor 140 is inserted into each of the module receivers 130a, 130b, 130c and 130d.

The plurality of module receivers 130a, 130b, 130c and 130d are positioned at fixed intervals with respect to the central point of the chamber lid 130. Also, each of the plural module receivers 130a, 130b, 130c and 130d may be positioned every predetermined angle with respect to the central point of the chamber lid 130, or may be positioned at different angles with respect to the central point of the chamber lid 130. In FIG. 2, the four module receivers 130a, 130b, 130c and 130d are formed in the chamber lid 130, but not limited to the four. For example, the chamber lid 130 may include '2N' or '2N+1' ('N' is an integer above 0) module receivers provided with respect to the central point of the chamber lid 130. Hereinafter, it is assumed that the chamber lid 130 includes the first to fourth module receivers 130a, 130b, 130c and 130d.

The gas distributor 140 is inserted into the chamber lid 130, wherein the gas distributor 140 locally confronts the substrate supporter 120. The gas distributor 140 spatially separates the process gas from the surface treatment gas (TG), and then downwardly distributes the separated process gas and the surface treatment gas (TG), whereby the aforementioned ALD process and the surface treatment process may be sequentially carried out in the process space for one cycle, or may be sequentially (or alternately) carried out every one cycle. In this case, one cycle may be defined by one rotation of the substrate supporter 120.

The process gas may contain source gas (SG) and reactant gas (RG) to form the thin film on the substrate (W).

The source gas (SG) may contain silicon (Si), titanium family element (Ti, Zr, Hf, and etc.), or aluminum (Al). For example, the source gas (SG) including titanium (Ti) may be titanium tetrachloride (TiCl4) gas. For example, the source gas (G2) containing silicon (Si) may be silane (SiH4) gas, disilane (Si2H6) gas, trisilane (Si3H8) gas, TEOS (Tetraethylorthosilicate) gas, DCS (Dichlorosilane) gas, HCD (Hexachlorosilane) gas, TriDMAS (Tri-dimethylaminosilane) gas, or TSA (Trisilylamine) gas.

The reactant gas (RG) may contain hydrogen (H2) gas, nitrogen (N2) gas, oxygen (O2) gas, nitrogen dioxide (NO2) gas, ammonia (NH3) gas, steam (H2O) gas, or ozone (O3) gas. In this case, the reactant gas (RG) may be mixed with purge gas containing nitrogen (N2) gas, argon (Ar) gas, xenon (Ze) gas, or helium (He) gas.

The surface treatment gas (TG) may contain hydrogen (H2) gas, nitrogen (N2) gas, gas obtained by mixing hydrogen (H2) gas and nitrogen (N2) gas, oxygen (O2) gas, nitrogen dioxide (NO2) gas, argon (Ar) gas, helium (He) gas, or ammonia (NH3) gas.

The gas distributor 140 may include a process gas distributor 142 and a surface treatment gas distributor 144.

The process gas distributor 142 is provided in each of the first to third module receivers 130a, 130b and 130c of the chamber lid 130, wherein the process gas distributor 142 spatially separates the source gas (SG) and the reactant gas (RG) from each other, and downwardly distributes the separated source gas (SG) and reactant gas (RG) on the substrate supporter 120. To this end, the process gas distributor 142 may include one source gas distribution module 142a, and first and second reactant gas distribution modules 142b and 142c.

The source gas distribution module 142a locally confronting the substrate supporter 120 is inserted into the first module receiver 130a of the chamber lid 130. The source gas distribution module 142a downwardly distributes the source gas (SG), which is supplied from an external source gas supplying means (not shown), on a first gas distribution area 120a locally defined on the substrate supporter 120. In this case, the first gas distribution area 120a may be defined by the process space between the first module receiver 130a and the substrate supporter 120.

As shown in FIG. 4, the source gas distribution module 142a may include a housing 210 and a gas supplying hole 220.

The housing 210 is formed in a rectangular case shape whose bottom is opened, whereby the housing 210 is provided with a gas distribution space 212 therein. The housing 210 downwardly distributes the source gas (SG) supplied to the gas distribution space 212. To this end, the housing 210 may include a ground plate 210a and a ground sidewall 210b.

The ground plate 210a is formed in a flat plate, and is connected with the upper surface of the chamber lid 130. As the ground plate 210a is electrically connected with the chamber lid 130, the ground plate 210a is electrically grounded through the chamber lid 130.

The ground sidewall 210b having a predetermined height vertically protrudes from a lower edge of the ground plate 210a, to thereby prepare the gas distribution space 212. The ground sidewall 210b is inserted into the first module receiver 130a prepared in the aforementioned chamber lid 130. In this case, a lower surface of the ground sidewall 210b may be positioned at the same height as a lower surface of the chamber lid 130, or may not protrude out of the lower surface of the chamber lid 130.

The gas distribution space 212 is surrounded by the ground sidewall 210b so that the gas distribution space 212 has a gas distribution port being communicated with the first gas distribution area 120a of the process space. In this case, a length of the gas distribution space 212 is longer than that of the substrate (W) placed onto the substrate supporter 120.

The gas supplying hole 220 vertically penetrating through the ground plate 210a is communicated with the gas distribution space 212. In this case, the plurality of gas supplying holes 220 may be provided at fixed intervals along a length direction of the ground plate 210a. The gas supplying hole 220 is connected with the external source gas supplying means through a gas supplying pipe (not shown), and the gas supplying hole 220 supplies the source gas (SG) supplied from the source gas supplying means to the gas distribution space 212. Accordingly, the source gas (SG) is diffused in the gas distribution space 212, and the diffused source gas is downwardly distributed on the aforementioned first gas distribution area 120a through the gas distribution port of the gas distribution space 212, whereby the source gas (SG) is distributed on the substrate (W) which is moved in accordance with rotation of the substrate supporter 120 and passes through a lower side of the source gas distribution module 142a, that is, the first gas distribution area 120a.

Referring once again to FIGS. 2 and 3, the first reactant gas distribution module 142b is spatially separated from the source gas distribution module 142a, and the first reactant gas distribution module 142b is inserted into the second module receiver 130b of the chamber lid 130. The first reactant gas distribution module 142b downwardly distributes the reactant gas (RG), which is supplied from an external reactant gas supplying means (not shown), on a second gas distribution area 120b locally defined on the substrate supporter 120. In this case, the second gas distribution area 120b may be defined by the process space between the second module receiver 130b and the substrate supporter 120 while being spatially separated from the first gas distribution area 120a.

As shown in FIG. 4, the first reactant gas distribution module 142b may include a housing 210 and a gas supplying hole 220. The first reactant gas distribution module 142b is identical in structure to the aforementioned source gas distribution module 142a, whereby a detailed description for the first reactant gas distribution module 142b will be omitted. The first reactant gas distribution module 142b downwardly distributes the reactant gas (RG), which is supplied from the external reactant gas supplying means to the gas distribution space 212 through the gas supplying hole 220, on the second gas distribution area 120b. Accordingly, the reactant gas (RG) is distributed on the substrate (W) which is moved by rotation of the substrate supporter 120 and passes through a lower side of the first reactant gas distribution module 142b, that is, the second gas distribution area 120b.

The second reactant gas distribution module 142c is inserted into the third module receiver 130c of the chamber lid 130 while being spatially separated from the source gas distribution module 142a and the first reactant gas distribution module 142b, wherein the second reactant gas distribution module 142c and the source gas distribution module 142a are symmetric with respect to the central point of the chamber lid 130. The second reactant gas distribution module 142c downwardly distributes the reactant gas (RG), which is supplied from the reactant gas supplying means, on the third gas distribution area 120c locally defined on the substrate supporter 120. In this case, the third gas distribution area 120c may be defined by the process space between the third module receiver 130c and the substrate supporter 120, wherein the third gas distribution area 120c may be spatially separated from the first and second gas distribution areas 120a and 120b.

As shown in FIG. 4, the second reactant gas distribution module 142c may include a housing 210 and a gas supplying hole 220. This structure is identical to that of the aforementioned source gas distribution module 142a, whereby a detailed description for the same structure will be omitted. The second reactant gas distribution module 142c downwardly distributes the reactant gas (RG), which is supplied from the external reactant gas supplying means to the gas distribution space 212 through the gas supplying hole 220, on the third gas distribution area 120c. Accordingly, the reactant gas (RG) is distributed on the substrate (W) which is moved by rotation of the substrate supporter 120 and passes through a lower side of the second reactant gas distribution module 142c, that is, the third gas distribution area 120c.

The surface treatment gas distributor 144 is provided in the fourth module receiver 130d of the chamber lid 130, wherein the surface treatment gas distributor 144 is spatially separated from the process gas distributor 142. The surface treatment gas distributor 144 downwardly distributes the surface treatment gas (TG), which is supplied from an external surface treatment gas supplying means (not shown), on the substrate supporter 120, locally. To this end, the surface treatment gas distributor 144 may include one surface treatment gas distribution module 144a.

The surface treatment gas distribution module 144a is inserted into the fourth module receiver 130d of the chamber lid 130 while being spatially separated from the aforementioned source gas distribution module 142a and the aforementioned first and second reactant gas distribution modules 142b and 142c, wherein the surface treatment gas distribution module 144a and the first reactant gas distribution module 142b are symmetric with respect to the central point of the chamber lid 130. The surface treatment gas distribution module 144a downwardly distributes the surface treatment gas (TG), which is supplied from the surface treatment gas supplying means, on the fourth gas distribution area 120d locally defined on the substrate supporter 120. In this case, the fourth gas distribution area 120d may be defined by the process space between the fourth module receiver 130d and the substrate supporter 120, wherein the fourth gas distribution area 120d may be spatially separated from the first, second and third gas distribution areas 120a, 120b and 120c.

As shown in FIG. 4, the surface treatment gas distribution module 144a may include a housing 210 and a gas supplying hole 220. This structure is identical to that of the aforementioned source gas distribution module 142a, whereby a detailed description for the same structure will be omitted. The surface treatment gas distribution module 144a downwardly distributes the surface treatment gas (TG), which is supplied from the external surface treatment gas supplying means to the gas distribution space 212 through the gas supplying hole 220, on the fourth gas distribution area 120d. Accordingly, the surface treatment gas (TG) is distributed on the substrate (W) which is moved by rotation of the substrate supporter 120 and passes through a lower side of the surface treatment gas distribution module 144a, that is, the fourth gas distribution area 120d.

A substrate processing method using the above substrate processing apparatus according to the embodiment of the present invention will be described as follows.

First, the plurality of substrates (W) are loaded at fixed intervals and placed onto the substrate supporter 120.

Then, the substrate supporter 120 having the plurality of substrates (W) loaded and placed thereonto is rotated to the predetermined direction (for example, counterclockwise direction).

Thereafter, the source gas (SG), reactant gas (RG) and surface treatment gas (TG) are spatially separated through the use of process gas distributor 142 and surface treatment gas distributor 144, and then downwardly distributed on the respective first to fourth gas distribution areas 120a, 120b, 120c and 120d. In this case, the source gas (SG) is downwardly distributed on the first gas distribution area 120a through the aforementioned source gas distribution module 142a, the reactant gas (RG) is downwardly distributed on the second and third gas distribution areas 120b and 120c through the aforementioned first and second reactant gas distribution modules 142b and 142c, and the surface treatment gas (TG) is downwardly distributed on the fourth gas distribution area 120d through the aforementioned surface treatment gas distribution module 144a. The source gas (SG), reactant gas (RG) and surface treatment gas (TG) may be distributed at the same time, or may be sequentially distributed in accordance with the rotation speed of the substrate supporter 120 and the movement of the substrate (W).

According as the plurality of substrates (W) pass through the first to third gas distribution areas 120a, 120b and 120c in accordance with the rotation of the substrate supporter 120, the plurality of substrates (W) are exposed to the source gas (SG) and the reactant gas (RG) distributed to the first to third gas distribution areas 120a, 120b and 120c, whereby a predetermined thin film is deposited on each of the substrates (W) by the mutual reaction between the source gas (SG) and the reactant gas (RG). Also, the substrate (W) with the predetermined thin film deposited thereon passes through the fourth gas distribution area 120d in accordance with the rotation of the substrate supporter 120, the substrate (W) with the predetermined thin film deposited thereon is exposed to the surface treatment gas (TG) distributed to the fourth gas distribution area 120d. In this case, the surface treatment gas (TG) enables to perform a surface treatment on the thin film deposited on the substrate (W), thereby removing foreign matters from the surface and inside of the thin film deposited on the substrate (W).

For example, if a titanium nitride (TiN) thin film is deposited on the substrate (W), the aforementioned source gas distribution module 142a distributes the source gas (SG) containing titanium tetrachloride (TiCl4) gas, each of the first and second reactant gas distribution modules 142b and 142c distributes the reactant gas (RG) containing ammonia (NH3) gas, and the surface treatment gas distribution module 144a distributes the surface treatment gas (TG) containing mixed gas of hydrogen (H2) gas and nitrogen (N2) gas. Accordingly, the titanium nitride (TiN) thin film is deposited on the substrate (W) by the mutual reaction between the source gas (SG) containing titanium tetrachloride (TiCl4) gas and the reactant gas (RG) containing ammonia (NH3) gas. Also, a chlorine component, which corresponds to an impurity existing in the surface and inside of the titanium nitride (TiN) thin film deposited on the substrate (W), combines with the surface treatment gas (TG) containing mixed gas of hydrogen (H2) gas and nitrogen (N2) gas, whereby hydrogen chloride (HCl) gas and nitrogen (N2) gas generate by the combination of the chlorine component and the surface treatment gas (TG), that is, the chlorine component is removed from the surface and inside of the titanium nitride (TiN) thin film.

Figure 5:
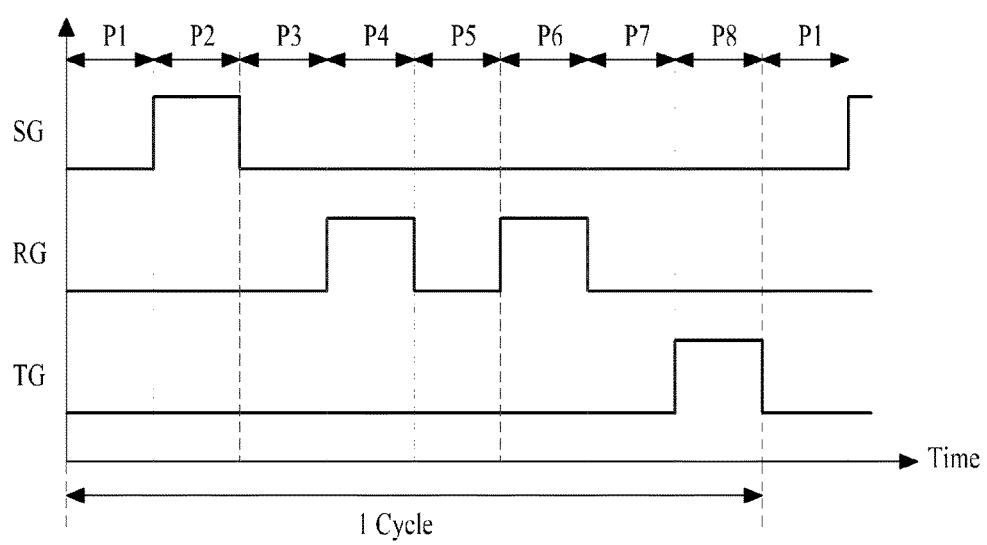
FIG. 5 illustrates another modified embodiment of the substrate processing method according to the first embodiment of the present invention.

FIG. 5 illustrates another modified embodiment of the substrate processing method according to the first embodiment of the present invention, which explains the thin film deposition process and surface treatment process for the substrate (W) placed in 12 o'clock direction of the substrate supporter 120 of FIG. 3.

In the process space, the thin film deposition process and the surface treatment process for the substrate (W) may be sequentially carried out during one cycle for one rotation of the substrate supporter 120.

In detail, the substrate (W) successively passes through first to eighth sections (P1 to P8) defined on the substrate supporter 120 in accordance with one rotation of the substrate supporter 120. Thus, the source gas (SG), reactant gas (RG), reactant gas (RG) and surface treatment gas (TG) sequentially reach the substrate (W). That is, the source gas (SG) distributed to the first gas distribution area 120a reaches the substrate (W) for the second section (P2) of one cycle, the reactant gas (RG) distributed to the second and third gas distribution areas 120b and 120c reaches the substrate (W) for the fourth and sixth sections (P4, P6) of one cycle, and the surface treatment gas (TG) distributed to the surface treatment gas distribution area 120d reaches the substrate (W) for the eighth section (P8) of one cycle.

Accordingly, when the substrate (W) passes through the sixth section (P6) of one cycle in accordance with the rotation of the substrate supporter 120, the predetermined thin film is deposited on the substrate (W) by the mutual reaction between the reactant gas (RG) and the source gas (SG) on the basis of ALD process. Also, when the substrate (W) passes through the eighth section (P8) of one cycle in accordance with the rotation of the substrate supporter 120, the foreign matters included in the surface and inside of the thin film deposited on the substrate (W) are removed therefrom by the surface treatment process using the surface treatment gas (TG) distributed to the fourth gas distribution area 120d.

In the aforementioned substrate processing method, the source gas (SG), the reactant gas (RG) and the surface treatment gas (TG) are simultaneously distributed for one cycle, but not limited to this method. For example, the source gas (SG), the reactant gas (RG) and the surface treatment gas (TG) may be sequentially distributed every cycle. That is, after only the source gas (SG) is distributed for the first cycle, only the reactant gas (RG) is distributed for the second cycle, and then only the surface treatment gas (TG) is distributed for the third cycle.

As mentioned above, the substrate processing apparatus and substrate processing method according to the first embodiment of the present invention sequentially or repetitively performs the thin film deposition process for depositing the thin film on the substrate (W) and the surface treatment process for removing the foreign matters from the thin film deposited on the substrate (W) inside the process space, whereby it is possible to improve the quality of thin film deposited on the substrate (W), and also to easily control the quality of thin film through the thin film deposition process of ALD method. Especially, the surface treatment process is carried out in a short time period after the thin film is deposited on the substrate (W), whereby the surface treatment gas (TG) permeates into the deep inside of the thin film, thereby improving the surface treatment efficiency, and improving the quality of thin film by reducing resistivity and surface roughness at the same thickness.

Figure 6:
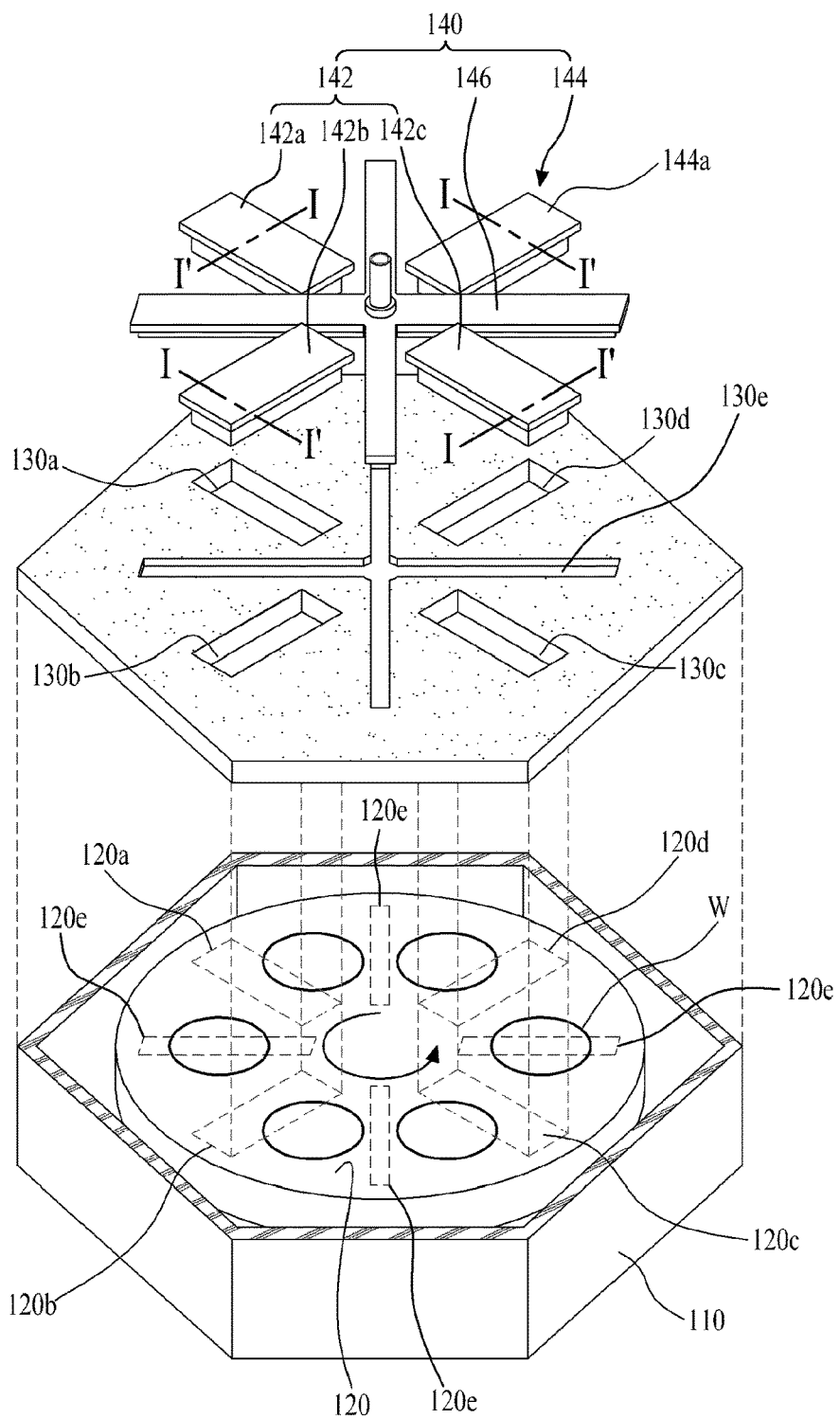
FIG. 6 is a perspective view illustrating a substrate processing apparatus according to the second embodiment of the present invention.
Figure 7:
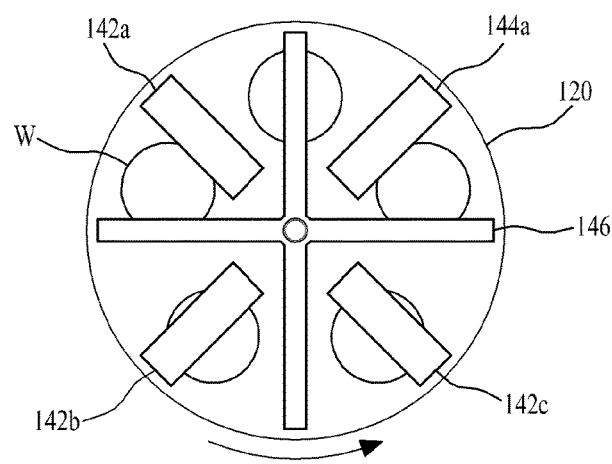
FIG. 7 is a concept view illustrating an arrangement structure of a gas distributor shown in FIG. 6.

FIG. 6 is a perspective view illustrating a substrate processing apparatus according to the second embodiment of the present invention. FIG. 7 is a concept view illustrating an arrangement structure of a gas distributor shown in FIG. 6.

Referring to FIGS. 6 and 7, the substrate processing apparatus according to the second embodiment of the present invention may include a process chamber 110, a substrate supporter 120, a chamber lid 130, and a gas distributor 140. Except the gas distributor 140, the substrate processing apparatus according to the second embodiment of the present invention is identical in structure to the substrate processing apparatus according to the first embodiment of the present invention, whereby a detailed explanation for the same structures will be omitted.

The gas distributor 140 may include a process gas distributor 142, a surface treatment gas distributor 144, and a purge gas distribution module 146.

The process gas distributor 142 and the surface treatment gas distributor 144 are the same as those of the substrate processing apparatus according to the first embodiment of the present invention, whereby a detailed description for the process gas distributor 142 and the surface treatment gas distributor 144 will be omitted.

The purge gas distribution module 146 is provided in the chamber lid 130, wherein the purge gas distribution module 146 is overlapped with a purge gas distribution area 120e defined in-between each of first to fourth gas distribution areas 120a, 120b, 120c and 120d. Accordingly, the purge gas distribution module 146 is positioned between the process gas distributor 142 and the surface treatment gas distributor 144, that is, in-between each of the aforementioned source gas distribution module 142a, the aforementioned first and second reactant gas distribution modules 142b and 142c, and the aforementioned surface treatment gas distribution module 144a.

The purge gas distribution module 146 may be formed in "+", "x" or "*" shape in accordance with the arrangement structure of the process gas distributor 142 and the surface treatment gas distributor 144, and the purge gas distribution module 146 may be inserted into a purge gas distribution module receiver 130e formed in the chamber lid 130. The purge gas distribution module 146 downwardly distributes purge gas, which is supplied from an external purge gas supplying means (not shown), to the plurality of purge gas distribution areas 120e, respectively.

The purge gas purges the source gas (SG) which is not deposited on the substrate (W) and/or the reactant gas (RG) which remains without reacting with the source gas (SG). Also, the purge gas distributed in-between each of the first, second, third and fourth gas distribution areas 120a, 120b, 120c and 120d forms an air circuit which enables to spatially separate the gas distributed to each of the first, second, third and fourth gas distribution areas 120a, 120b, 120c and 120d. To this end, the purge gas may be formed of inert gas.

Except that the purge gas is additionally distributed to the purge gas distribution area 120e defined in-between each of the first, second, third and fourth gas distribution areas 120a, 120b, 120c and 120d, a substrate processing method using the substrate processing apparatus according to the second embodiment of the present invention is identical to the above substrate processing method using the substrate processing apparatus according to the first embodiment of the present invention. In the substrate processing method according to the second embodiment of the present invention, it is possible to improve the quality of thin film deposited on the substrate (W) by purging the source gas (SG) which is not deposited on the substrate (W) and/or the reactant gas (RG) which remains without reacting with the source gas (SG) through the use of purge gas.

Figure 8:
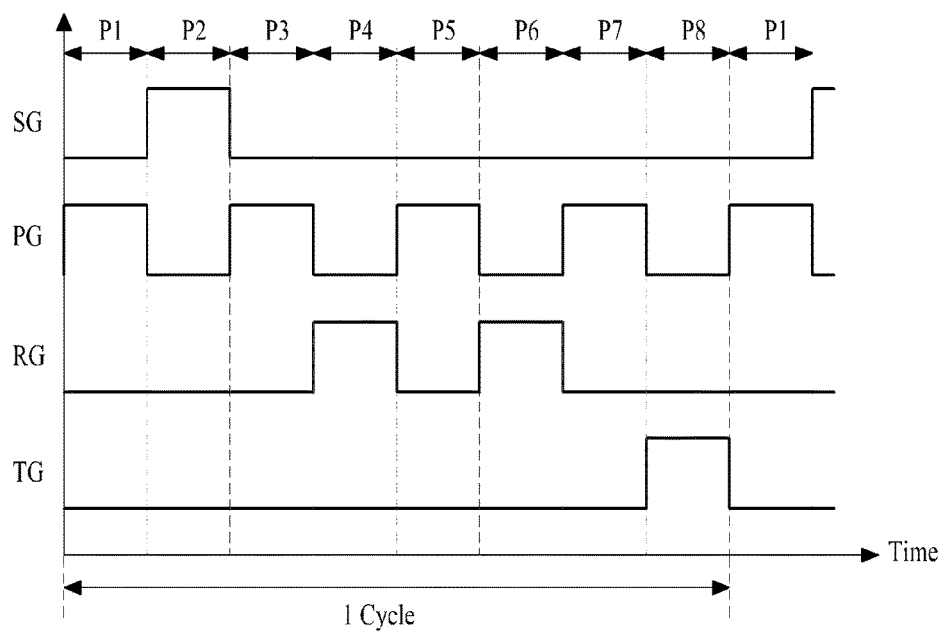
FIG. 8 illustrates another modified embodiment of the substrate processing method according to the second embodiment of the present invention.

FIG. 8 illustrates another modified embodiment of the substrate processing method according to the second embodiment of the present invention, which explains the thin film deposition process and surface treatment process for the substrate (W) placed in 12 o'clock direction of the substrate supporter 120 of FIG. 7.

In the process space, the thin film deposition process and the surface treatment process for the substrate (W) may be sequentially carried out during one cycle for one rotation of the substrate supporter 120.

In detail, the substrate (W) successively passes through first to eighth sections (P1 to P8) defined on the substrate supporter 120 in accordance with one rotation of the substrate supporter 120. Thus, the purge gas (PG), source gas (SG), purge gas (PG), reactant gas (RG), purge gas (PG), reactant gas (RG), purge gas (PG) and surface treatment gas (TG) sequentially reach the substrate (W). That is, the purge gas (PG) distributed to the purge gas distribution area 120e reaches the substrate (W) for the first, third, fifth and seventh sections (P1, P3, P5, P7) of one cycle, the source gas (SG) distributed to the first gas distribution area 120a reaches the substrate (W) for the second section (P2) of one cycle, the reactant gas (RG) distributed to the second and third gas distribution areas 120b and 120c reaches the substrate (W) for the fourth and sixth sections (P4, P6) of one cycle, and the surface treatment gas (TG) distributed to the surface treatment gas distribution area 120d reaches the substrate (W) for the eighth section (P8) of one cycle.

Accordingly, when the substrate (W) passes through the first to seventh sections (P1 to P7) of one cycle in accordance with the rotation of the substrate supporter 120, the predetermined thin film is deposited on the substrate (W) by the mutual reaction between the reactant gas (RG) and the source gas (SG) on the basis of ALD process. Also, some of source material deposited on the surface of the substrate (W) by the use of source gas (SG), that is, source material which is not deposited on the substrate (W) is removed by the use of purge gas (PG) for the third section (P3) of one cycle, and the reactant gas (RG) which remains without reacting with the source gas (SG) is removed by the use of purge gas (PG) for the fifth and seventh sections (P5, P7) of one cycle. Also, when the substrate (W) passes through the eighth section (P8) of one cycle in accordance with the rotation of the substrate supporter 120, the foreign matters included in the surface and inside of the thin film deposited on the substrate (W) are removed therefrom by the surface treatment process using the surface treatment gas (TG) distributed to the fourth gas distribution area 120d.

In the aforementioned substrate processing method, the source gas (SG), the reactant gas (RG) and the surface treatment gas (TG) are simultaneously distributed for one cycle, but not limited to this method. For example, while continuously distributing the purge gas (PG) without pause, the source gas (SG), the reactant gas (RG) and the surface treatment gas (TG) may be sequentially distributed every cycle. For example, under conditions that the purge gas (PG) is continuously distributed, only the source gas (SG) is distributed for the first cycle, only the reactant gas (RG) is distributed for the second cycle, and then only the surface treatment gas (TG) is distributed for the third cycle. In this case, the surface treatment gas (TG) may be distributed for at least one cycle of the first to third cycles.

As mentioned above, the substrate processing apparatus and substrate processing method according to the second embodiment of the present invention enables to purge the source gas (SG) which is not deposited on the substrate (W) and/or the reactant gas (RG) which remains without reacting with the source gas (SG) through the use of purge gas, thereby improving the quality of thin film deposited on the substrate (W).

Figure 9:
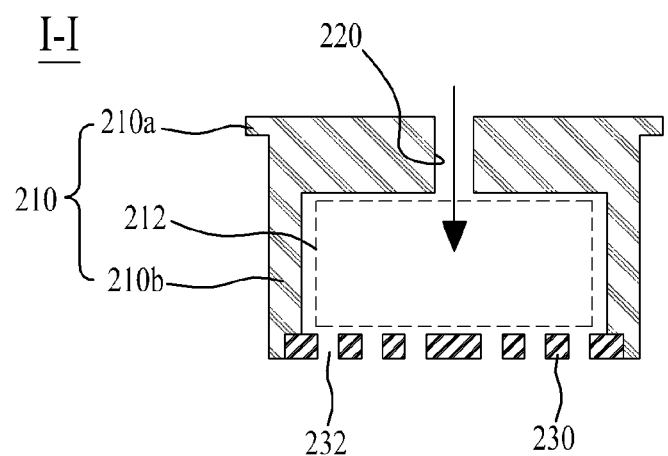
FIG. 9 is a cross sectional view illustrating a gas distribution module according to the first modified embodiment in the substrate processing apparatus of the first and second embodiments of the present invention.

FIG. 9 is a cross sectional view illustrating the gas distribution module according to the first modified embodiment in the substrate processing apparatus of the first and second embodiments of the present invention, which is obtained by additionally forming a gas distribution pattern member 230 in the gas distribution space 212 of the gas distribution module shown in FIG. 4. Hereinafter, only different structures will be described in detail.

The gas distribution pattern member 230 increases a distribution pressure of the gas (SG, RG, TG) which is supplied to the aforementioned gas distribution space 212 and then downwardly distributed on the substrate supporter 120. In this case, the gas distribution pattern member 230 may be combined with a lower surface of a ground sidewall 210b so as to cover the gas distribution port of the gas distribution space 212, or may be formed of an insulating plate (or shower head) of an insulating material having no polarity, and combined with a lower surface of the ground sidewall 210b so as to cover the gas distribution port of the gas distribution space 212. Accordingly, the gas distribution space 212 is prepared between a ground plate 210a and the gas distribution pattern member 230, whereby the gas (SG, RG, TG) supplied to the gas distribution space 212 through the aforementioned gas supplying hole 220 is diffused and buffered inside the gas distribution space 212.

The gas distribution pattern member 230 may include a gas distribution pattern 232 for downwardly distributing the gas (SG, RG, TG), which is supplied to the gas distribution space 212, toward the substrate (W).

The gas distribution pattern 232 is formed to have a plurality of holes (or a plurality of slits) which are provided at fixed intervals and penetrate through the gas distribution pattern member 230, wherein the gas distribution pattern 232 downwardly distributes the gas (SG, RG, TG), supplied to the gas distribution space 212, at a predetermined pressure. In this case, a diameter in each of the holes and/or an interval between the holes may be determined in a range suitable for distributing a uniform amount of gas to the entire areas of the substrate (W) which is moved based on an angular in accordance with the rotation of the substrate supporter 120. For example, the diameter of each hole may be gradually increased from the inside of the gas distribution module which is adjacent to the center of the substrate supporter 120 to the outside of the gas distribution module which is adjacent to the edge of the substrate supporter 120.

The aforementioned gas distribution pattern member 230 downwardly distributes the gas (SG, RG, TG) through the gas distribution pattern 232, and reduces the gas usage by delaying or congesting the distribution of gas (SG, RG, TG) through the plate shape with the holes, thereby improving use efficiency of the gas.

Figure 10:
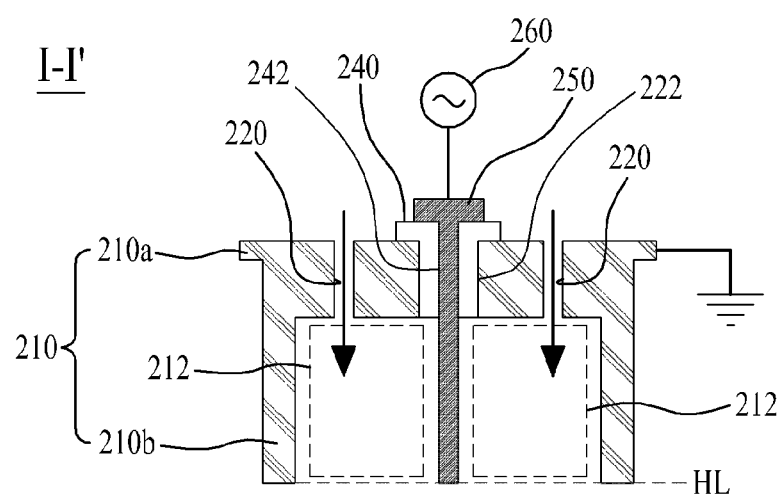
FIG. 10 is a cross sectional view illustrating a gas distribution module according to the second modified embodiment in the substrate processing apparatus of the first and second embodiments of the present invention.

FIG. 10 is a cross sectional view illustrating the gas distribution module according to the second modified embodiment in the substrate processing apparatus of the first and second embodiments of the present invention, which is obtained by additionally forming a plasma electrode 250 in the gas distribution space 212 of the gas distribution module shown in FIG. 4. Hereinafter, only different structures will be described in detail.

In the above substrate processing apparatus of the first and second embodiments of the present invention as well as the substrate processing apparatus of FIG. 4, the source gas (SG), the reactant gas (RG) and the surface treatment gas (TG), which are to be distributed on the substrate (W), are not activated. However, there is a need to activate at least any one of the source gas (SG), the reactant gas (RG) and the surface treatment gas (TG) in accordance with the kind of thin film to be deposited on the substrate (W), and to distribute the activated gas on the substrate (W). Accordingly, the substrate processing apparatus according to the first and second embodiments of the present invention activates at least any one of the source gas (SG), the reactant gas (RG) and the surface treatment gas (TG), and distributes the activated gas on the substrate (W).

In the second modified embodiment of the present invention, each of source gas distribution module 142a, first and second reactant gas distribution modules 142b and 142c, and surface treatment gas distribution module 144a may include the plasma electrode 250 which is inserted into the gas distribution space 212. To this end, a ground plate 210a of a housing 210 is provided with an insulating member insertion hole 222 being communicated with the gas distribution space 212, and an insulating member 240 is inserted into the insulating member insertion hole 222. The insulating member 240 is provided with an electrode insertion hole 242 being communicated with the gas distribution space 212, and the plasma electrode 250 is inserted into the electrode insertion hole 242.

The plasma electrode 250 is inserted into the gas distribution space 212, and is arranged in parallel to a ground sidewall 210b. In this case, a lower surface of the plasma electrode 250 may be positioned at the same height (HL) as a lower surface of the ground sidewall 210b, or may protrude out of the lower surface of the ground sidewall 210b. The ground sidewall 210b functions as a ground electrode for forming plasma together with the plasma electrode 250.

The plasma electrode 250 forms plasma by the use of gas (SG, RG, TG) supplied to the gas distribution space 212 in accordance with plasma power supplied from a plasma power supplier 260. In this case, the plasma is formed between the plasma electrode 250 and the ground electrode by an electric field formed between the plasma electrode 250 and the ground electrode in accordance with the plasma power. Accordingly, the gas (SG, RG, TG) supplied to the gas distribution space 212 is activated by the plasma, and is locally distributed on the substrate (W). In order to prevent the substrate (W) and/or the thin film deposited on the substrate (W) from being damaged by the plasma, an interval (or a gap) between the plasma electrode 250 and the ground electrode is smaller than an interval between the plasma electrode 250 and the substrate (W). Accordingly, the plasma is not formed between the substrate (W) and the plasma electrode 250, and the plasma is formed between the plasma electrode 250 and the ground electrode which are arranged in parallel and are also provided at a predetermined interval from the substrate (W), to thereby prevent the substrate (W) and/or the thin film from being damaged by the plasma.

The plasma power may be high frequency power or radio frequency (RF) power, for example, lower frequency (LF) power, middle frequency (MF) power, high frequency (HF) power, or very high frequency (VHF) power. In this case, the LF power may have 3 kHz~300 kHz frequency, the MF power may have 300 kHz~3 MHz frequency, the HF power may have 3 MHz~30 MHz frequency, and the VHF power may have 30 MHz~300 MHz frequency.

A feed cable for connecting the plasma electrode 250 and the plasma power supplier 260 may be connected with an impedance matching circuit (not shown). The impedance matching circuit matches load impedance and source impedance of the plasma power supplied from the plasma power supplier 260 to the plasma electrode 250. The impedance matching circuit may include at least two of impedance element (not shown) formed of at least one of variable capacitor and variable inductor.

In the substrate processing apparatus provided with the gas distribution module including the plasma electrode 250, it is possible to improve the quality of thin film by the use of plasma of the surface treatment gas used in the aforementioned cycle.

For example, if the surface treatment gas of oxygen (O2) gas or nitrous oxide (N2O) is used in the aforementioned cycle, it is possible to improve the quality of thin film by the use of oxygen plasma. Especially, if using the oxygen plasma, it is possible to increase a density of thin film, to improve the quality of thin film by reducing oxygen vacancy, to enable a removal of hydrogen or hydroxyl group (OH), and to enable a formation of oxy-nitride thin film.

According to another example, if using the surface treatment gas of argon (Ar) gas or helium (He) gas in the aforementioned cycle, a surface treatment process and a purge process are simultaneously carried out in the aforementioned cycle, whereby a density of thin film is increased by a purge function in accordance with plasma of the argon (Ar) gas or helium (He) gas, and thus an etching ratio of thin film is reduced when patterning the thin film.

In the above description, each of source gas distribution module 142a, first and second reactant gas distribution modules 142b and 142c, and surface treatment gas distribution module 144a may include the plasma electrode 250, but not limited to this structure. According to the kind of thin film to be deposited on the substrate (W), the source gas and/or the reactant gas may be distributed on the substrate (W) without being activated. In this case, the plasma electrode 250 is not formed in at least any one of the source gas distribution module 142a and the first and second reactant gas distribution modules 142b and 142c, that is, at least any one of the source gas distribution module 142a and the first and second reactant gas distribution modules 142b and 142c may be formed in the structure of FIG. 4 or FIG. 9.

The gas distribution module of the modified second embodiment may further include the gas distribution pattern member 230 of FIG. 9. In this case, the plasma electrode 250 is provided inside the gas distribution space 212, and is not brought into contact with the gas distribution pattern member 230.

Figure 11:
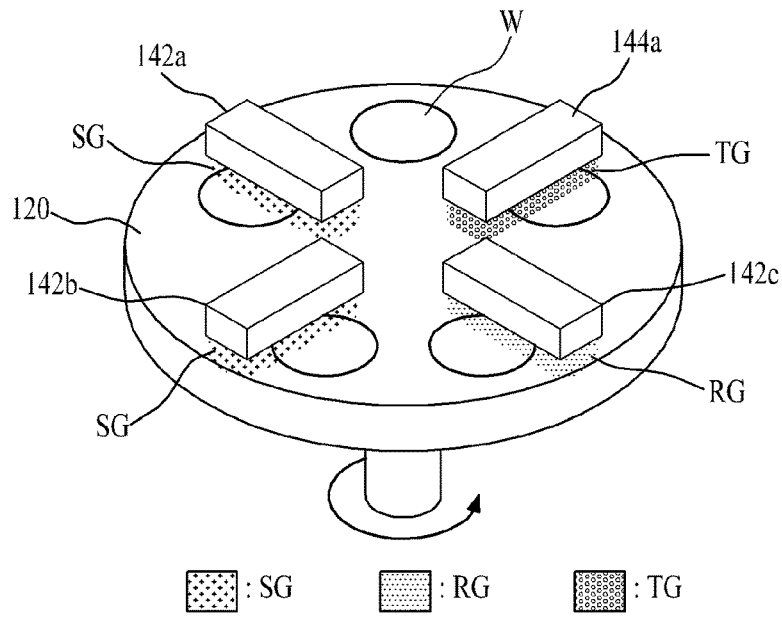
FIGS. 11 and 12 illustrate a gas distributor of modified embodiments in the substrate processing apparatus according to the first and second embodiments of the present invention.
Figure 12:
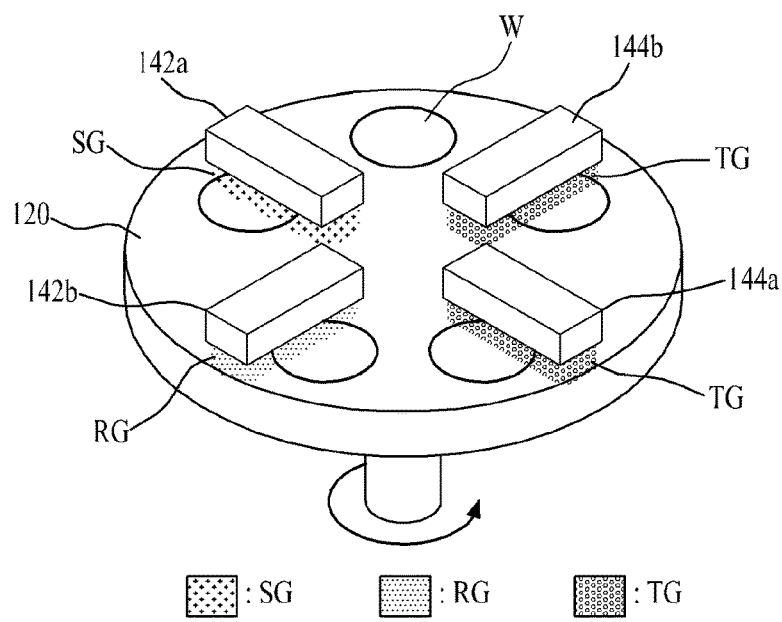

FIG. 11 and FIG. 12 illustrate the gas distributor of the modified embodiment in the substrate processing apparatus according to the first and second embodiments of the present invention.

In the substrate processing apparatus of the first and second embodiments of the present invention shown in FIG. 3 and FIG. 7, the gas distributor 140 includes one source gas distribution module 142a, two reactant gas distribution modules 142b and 142c, and one surface treatment gas distribution module 144a. However, the number of source gas distribution module, the number of reactant gas distribution module and the number of surface treatment gas distribution module may vary depending on the process condition of the thin film or the process properties.

Referring to FIG. 11 in connection with FIG. 2 and FIG. 6, the gas distributor according to the first modified embodiment of the present invention includes first and second source gas distribution modules 142a and 142b, one reactant gas distribution module 142c, and one surface treatment gas distribution module 144a. In this case, the first reactant gas distribution module 142b of FIG. 3 is substituted by the source gas distribution module. Each of the first and second source gas distribution modules 142a and 142b, one reactant gas distribution module 142c, and one surface treatment gas distribution module 144a may be formed in the structure shown in FIG. 4, FIG. 9 or FIG. 10. Hereinafter, only different structures will be described in detail.

The first source gas distribution module 142a, which is inserted into a first module receiver 130a of a chamber lid 130, distributes source gas (SG) to the aforementioned first gas distribution area 120a.

The second source gas distribution module 142b, which is inserted in to a second module receiver 130b of the chamber lid 130, distributes the source gas (SG) to the aforementioned second gas distribution area 120b.

The reactant gas distribution module 142c, which is inserted into a third module receiver 130c of the chamber lid 130, distributes reactant gas (RG) to the aforementioned third gas distribution area 120c.

The surface treatment gas distribution module 144a, which is inserted into a fourth module receiver 130d of the chamber lid 130, distributes surface treatment gas (TG) to the aforementioned fourth gas distribution area 120d.

Referring to FIG. 12 in connection with FIG. 2 and FIG. 6, the gas distributor according to the second modified embodiment of the present invention includes one source gas distribution module 142a, one reactant gas distribution module 142b, and first and second surface treatment gas distribution modules 144a and 144b. In this case, the reactant gas distribution module 142c of FIG. 3 is substituted by the surface treatment gas distribution module. Each of one source gas distribution module 142a, one reactant gas distribution module 142b, and the first and second surface treatment gas distribution modules 144a and 144b may be formed in the structure shown in FIG. 4, FIG. 9 or FIG. 10. Hereinafter, only different structures will be described in detail.

The source gas distribution module 142a, which is inserted into a first module receiver 130a of a chamber lid 130, distributes source gas (SG) to the aforementioned first gas distribution area 120a.

The reactant gas distribution module 142b, which is inserted into a second module receiver 130b of the chamber lid 130, distributes reactant gas (RG) to the aforementioned second gas distribution area 120b.

The first surface treatment gas distribution module 144a, which is inserted into a third module receiver 130c of the chamber lid 130, distributes surface treatment gas (TG) to the aforementioned third gas distribution area 120c.

The second surface treatment gas distribution module 144b, which is inserted into a fourth module receiver 130d of the chamber lid 130, distributes the surface treatment gas (TG) to the aforementioned fourth gas distribution area 120d.

Eventually, the gas distributor according to the present invention includes the source gas distribution module, the reactant gas distribution module and the surface treatment gas distribution module. However, the number of source gas distribution module, the number of reactant gas distribution module and the number of surface treatment gas distribution module may vary depending on the process condition of the thin film or the process properties.

Figure 13:
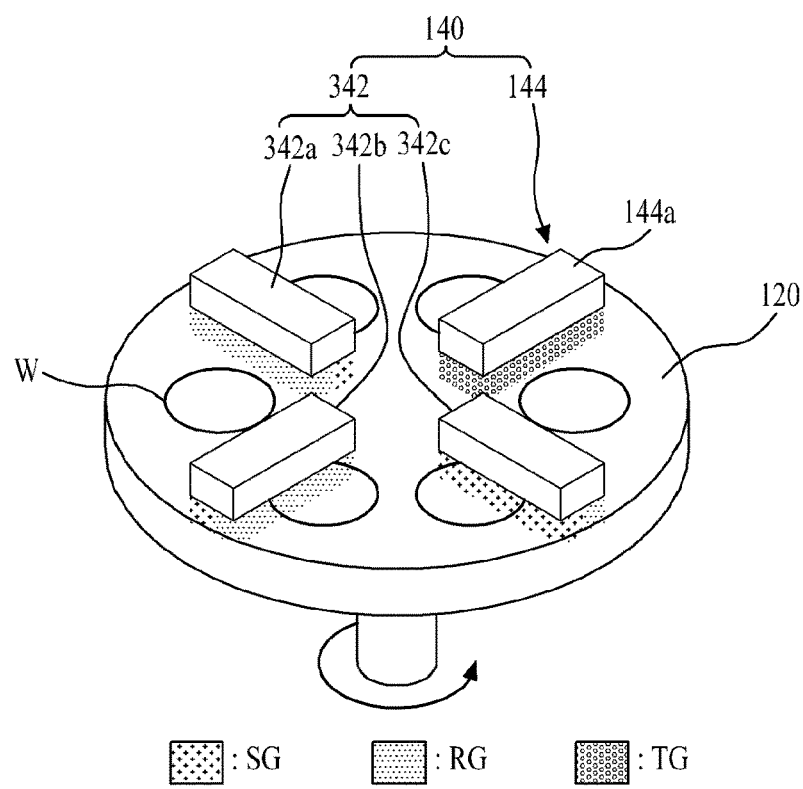
FIG. 13 illustrates a gas distributor of a substrate processing apparatus according to the third embodiment of the present invention.

FIG. 13 illustrates a gas distributor of a substrate processing apparatus according to the third embodiment of the present invention.

In the aforementioned gas distributor of the substrate processing apparatus shown in FIG. 2 to FIG. 12, each of the source gas (SG) and the reactant gas (RG) is distributed through the individual gas distribution modules so as to spatially separate the source gas (SG) from the reactant gas (RG), whereby the ALD deposition process is carried out by the movement of the substrate (W) in accordance with the rotation of the substrate supporter 120. However, the source gas (SG) and the reactant gas (RG) may be simultaneously distributed through the respective gas distribution modules by the movement of the substrate (W) in accordance with the rotation of the substrate supporter 120 inside the process space, whereby the thin film may be deposited on the substrate (W) by a local CVD (Chemical Vapor Deposition) process. This local CVD (Chemical Vapor Deposition) process enables to increase the thin film deposition speed and thus improve the yield.

To this end, the gas distributor 140 of the substrate processing apparatus according to the third embodiment of the present invention includes a process gas distributor 342 and a surface treatment gas distributor 144, as shown in FIG. 13. Except the structure of the process gas distributor 342, the gas distributor 140 according to the third embodiment of the present invention is identical to the gas distributor 140 according to the above embodiments of the present invention. Thus, only different structures will be described in detail.

The process gas distributor 342 includes first to third process gas distribution modules 342a, 342b and 342c which are respectively provided in first to third module receivers 130a, 130b and 130c.

Each of the first to third process gas distribution modules 342a, 342b and 342c includes a housing 410, a partition member 415, and first and second gas supplying holes 420a and 420b.

The housing 410 includes a ground plate 410a and a ground sidewall 410b.

The ground plate 410a is formed in a flat plate, and is connected with an upper surface of a chamber lid 130. As the ground plate 410a is electrically connected with the chamber lid 130, the ground plate 410a is electrically grounded through the chamber lid 130.

The ground sidewall 410b having a predetermined height vertically protrudes from a lower edge of the ground plate 410a, to thereby prepare first and second gas distribution spaces 412a and 412b. The ground sidewall 410b is inserted into the module receiver 130a, 130b and 130c prepared in the chamber lid 130. In this case, a lower surface of the ground sidewall 410b may be positioned at the same height as a lower surface of the chamber lid 130, or may not protrude out of the lower surface of the chamber lid 130.

The partition member 415 vertically protrudes from a central portion of a lower surface of the ground plate 410a, thereby preparing the first and second gas distribution spaces 412a and 512b spatially separated from each other inside the housing 410. Accordingly, each of the first and second gas distribution spaces 412a and 412b is surrounded by the ground sidewalls 410b and the partition member 415, wherein the first and second gas distribution spaces 412a and 412b are spatially separated from each other. The partition member 415 may be formed as one body with the housing 410, or may be electrically grounded through the chamber lid 130 through the ground plate 410a, whereby the partition member 415 may function as the ground electrode.

The first gas supplying hole 420a, which vertically penetrates through the ground plate 410a, is communicated with the first gas distribution space 412a. In this case, the plurality of first gas supplying holes 420a may be provided at fixed intervals along a length direction of the ground plate 410a. The first gas supplying hole 420a is connected with an external source gas supplying means through a source gas supplying pipe (not shown), wherein the first gas supplying hole 420a supplies the source gas (SG), which is supplied through the source gas supplying pipe, to the first gas distribution space 412a. Accordingly, the source gas (SG) is diffused inside the first gas distribution space 412a, and the diffused source gas is downwardly distributed to the aforementioned gas distribution areas 120a, 120b and 120c through the first gas distribution space 412a, whereby the source gas (SG) is distributed on the substrate (W) which is moved in accordance with rotation of the substrate supporter 120 and passes through a lower side of the process gas distribution modules 342a, 342b and 342c, that is, the first to third gas distribution areas 120a, 120b and 120c.

The second gas supplying hole 420b, which vertically penetrates through the ground plate 410a, is communicated with the second gas distribution space 412b. In this case, the plurality of second gas supplying holes 420b may be provided at fixed intervals along a length direction of the ground plate 410a. The second gas supplying hole 420b is connected with an external reactant gas supplying means through a reactant gas supplying pipe (not shown), wherein the second gas supplying hole 420b supplies the reactant gas (RG), which is supplied through the reactant gas supplying pipe, to the second gas distribution space 412b. Accordingly, the reactant gas (RG) is diffused inside the second gas distribution space 412b, and the diffused reactant gas is downwardly distributed to the aforementioned gas distribution areas 120*a*, 120*b* and 120*c* through the second gas distribution space 412*b*, whereby the reactant gas (RG) is distributed on the substrate (W) is moved in accordance with rotation of the substrate supporter 120 and passes through a lower side of the process gas distribution modules 342*a*, 342*b* and 342*c*, that is, the first to third gas distribution areas 120*a*, 120*b* and 120*c*.

The first to third process gas distribution modules 342*a*, 342*b* and 342*c* respectively distribute the source gas (SG) and the reactant gas (RG) to the first to third gas distribution areas 120*a*, 120*b* and 120*c* through the first and second gas distribution spaces 412*a* and 412*b* spatially separated from each other, at the same time, whereby the source gas (SG) and the reactant gas (RG) reach the substrate (W) at the same time. Thus, the substrate (W), which is moved in accordance with the rotation of the substrate supporter 120, passes through the lower side of the process gas distribution modules 342*a*, 342*b* and 342*c*, that is, the first to third gas distribution areas 120*a*, 120*b* and 120*c* so that the substrate (W) is exposed to the source gas (SG) and the reactant gas (RG) at the same time, thereby depositing a predetermined thin film on the substrate (W) through CVD deposition process by the mutual reaction between the source gas (SG) and the reactant gas (RG).

According as the substrate (W) with the thin film deposited by the source gas (SG) and the reactant gas (RG) simultaneously distributed from the respective process gas distribution modules 342*a*, 342*b* and 342*c* is moved by the rotation of the substrate supporter 120, as shown in FIG. 4, FIG. 9 or FIG. 10, the substrate (W) passes through the lower side of the aforementioned surface treatment gas distribution module 144*a*, whereby the substrate (W) is exposed to the activated or unactivated surface treatment gas (TG). Thus, the surface treatment gas (TG) distributed to the thin film permeates into the inside of the thin film thinly deposited on the substrate (W), to thereby remove foreign matters from the surface and inside of the thin film. In this case, the surface treatment gas distribution module 144*a* distributes the surface treatment gas (TG) to the substrate (W) every cycle or plural cycles.

Meanwhile, each of the aforementioned first to third process gas distribution modules 342*a*, 342*b* and 342*c* may further include a gas distribution pattern member (not shown) provided in a lower surface of the housing 410 to cover a lower side of each of the first and second gas distribution spaces 412*a* and 412*b*. In this case, the gas distribution pattern member (not shown) is the same as the gas distribution pattern member 230 shown in FIG. 9, whereby a detailed explanation for the gas distribution pattern member (not shown) will be omitted.

A substrate processing method using the substrate processing apparatus with the aforementioned gas distributor 140 according to the third embodiment of the present invention will be described in detail as follows.

First, the plurality of substrates (W) are loaded at fixed intervals and placed onto the substrate supporter 120.

Then, the substrate supporter 120 having the plurality of substrates (W) loaded and placed thereonto is rotated to the predetermined direction (for example, counterclockwise direction).

Thereafter, the source gas (SG) and reactant gas (RG) are downwardly distributed to the first to third gas distribution areas 120*a*, 120*b* and 120*c* through the aforementioned process gas distributor 342, and are locally provided thereto. At the same time, the surface treatment gas (TG) is downwardly distributed to the fourth gas distribution area 120*d* through the surface treatment gas distributor 144. In this case, the source gas (SG) is downwardly distributed to each of the first to third gas distribution areas 120*a*, 120*b* and 120*c* through the first gas distribution space 412*a* of each of the first to third process gas distribution modules 342*a*, 342*b* and 342*c*. The reactant gas (RG) is downwardly distributed to each of the first to third gas distribution areas 120*a*, 120*b* and 120*c* through the second gas distribution space 412*b* of each of the first to third process gas distribution modules 342*a*, 342*b* and 342*c*.

According as each of the substrates (W) passes through the first to third gas distribution areas 120*a*, 120*b* and 120*c* in accordance with the rotation of the substrate supporter 120, the substrate (W) is exposed to the source gas (SG) and the reactant gas (RG) distributed to the first to third gas distribution areas 120*a*, 120*b* and 120*c*, whereby the predetermined thin film is deposited on each of the substrates (W) through the CVD deposition process by the mutual reaction between the source gas (SG) and the reactant gas (RG). Also, according as the substrate (W) with the predetermined thin film deposited thereon passes through the fourth gas distribution area 120*d* by the rotation of the substrate supporter 120, the substrate (W) is exposed to the surface treatment gas (TG) distributed to the fourth gas distribution area 120*d*. In this case, the surface treatment gas (TG) performs the surface treatment for the thin film which is thinly deposited on the substrate (W), thereby removing the foreign matters from the surface and inside of the thin film.

In the substrate processing method using the substrate processing apparatus according to the third embodiment of the present invention, after the thin film is deposited on the substrate (W) by the CVD deposition process inside the process space, the surface treatment process is carried out in a short time so that it is possible to improve quality of the thin film, and also to facilitate quality control of the thin film. Especially, the substrate processing apparatus and method according to the third embodiment of the present invention may sequentially perform the CVD deposition process and the surface treatment process for each cycle, or may perform the CVD deposition process every cycle and perform the surface treatment process every plural cycles. Thus, the substrate processing apparatus and method according to the third embodiment of the present invention realizes the more-improved quality of the CVD thin film in comparison to the case of performing the surface treatment after forming the bulk thin film.

In FIG. 13, the gas distributor 140 includes three process gas distribution modules 342*a*, 342*b* and 342*c*, and one surface treatment gas distribution module 144*a*, but not limited to this structure. For example, the gas distributor 140 may include two process gas distribution modules being adjacent to each other, and two surface treatment gas distribution modules arranged adjacent to the process gas distribution modules.

Also, the gas distributor 140 of the substrate processing apparatus according to the third embodiment of the present invention may further include a purge gas distribution module (not shown) for distributing purge gas in-between each of first to fourth gas distribution areas 120*a*, 120*b*, 120*c* and 120*d*. The purge gas distribution module is identical to the purge gas distribution module 146 shown in FIG. 6 and FIG. 7, whereby a detailed description for the purge gas distribution module (not shown) will be substituted by the above explanation of the purge gas distribution module 146 shown in FIG. 6 and FIG. 7.

Figure 14:
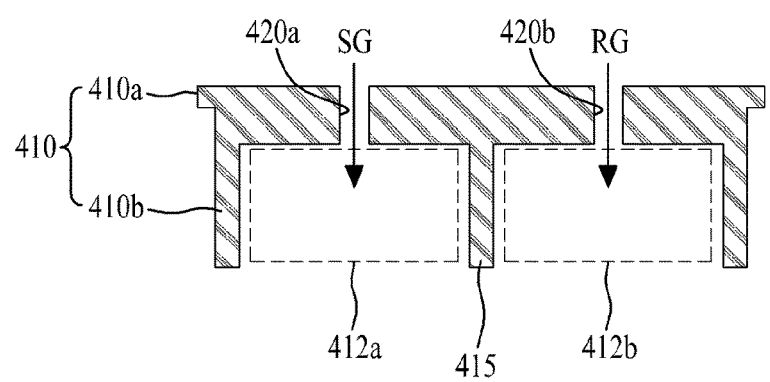
FIG. 14 is a cross sectional view illustrating a process gas distribution module shown in FIG. 13.
Figure 15:
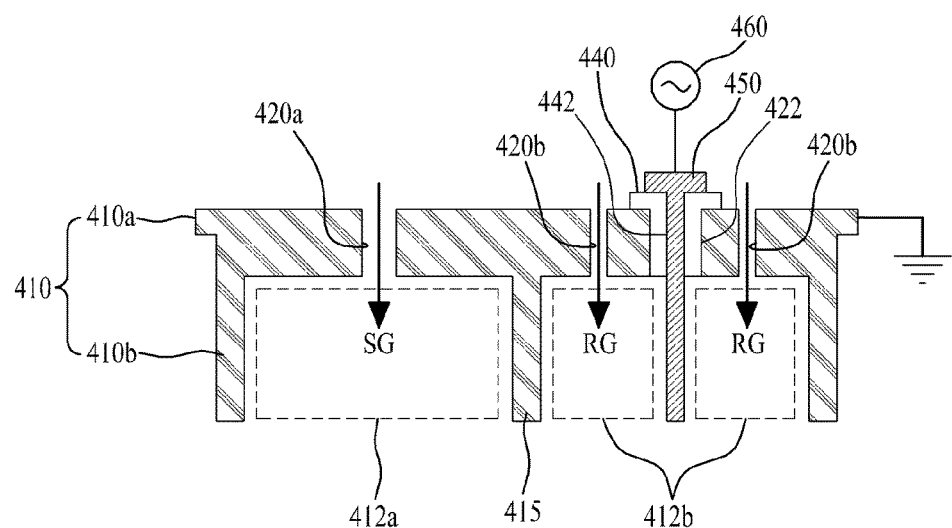
FIG. 15 is a cross sectional view illustrating a process gas distribution module according to the first modified embodiment in the substrate processing apparatus of the third embodiment of the present invention.

FIG. 15 is a cross sectional view illustrating the gas distribution module according to the first modified embodiment in the substrate processing apparatus of the third embodiment of the present invention, which is obtained by additionally forming a plasma electrode 450 in the second gas distribution space 412*b* of the process gas distribution module shown in FIG. 14. Hereinafter, only different structures will be described in detail.

In the above substrate processing apparatus of the third embodiment of the present invention as well as the substrate processing apparatus of FIG. 14, the reactant gas (RG), which is to be distributed on the substrate (W), is not activated. However, there is a need to activate the reactant gas (RG) in accordance with the kind of thin film to be deposited on the substrate (W), and to distribute the activated reactant gas on the substrate (W). Accordingly, the process gas distribution module according to the first modified embodiment in the substrate processing apparatus according to the third embodiment of the present invention activates the reactant gas (RG), and distributes the activated reactant gas on the substrate (W).

Each of first to third process gas distribution modules 342*a*, 342*b* and 342*c* according to the first modified embodiment may further include the plasma electrode 450 which is inserted into a second gas distribution space 412*b*. To this end, a ground plate 410*a* of a housing 410 is provided with an insulating member insertion hole 422 being communicated with the second gas distribution space 412*b*, and an insulating member 440 is inserted into the insulating member insertion hole 422. Also, the insulating member 440 is provided with an electrode insertion hole 442 being communicated with the second gas distribution space 412*b*, and the plasma electrode 450 is inserted into the electrode insertion hole 442.

The plasma electrode 450 is inserted into the second gas distribution space 412*b*, and is arranged in parallel to a ground sidewall 410*b*. In this case, a lower surface of the plasma electrode 450 may be positioned at the same height (HL) as a lower surface of the ground sidewall 410*b*, or may protrude out of the lower surface of the ground sidewall 410*b*. Each of the ground sidewall 410*b* and ground partition 415 functions as a ground electrode for forming plasma together with the plasma electrode 450.

The plasma electrode 450 forms plasma by the use of reactant gas (RG) supplied to the second gas distribution space 412*b* in accordance with plasma power supplied from a plasma power supplier 460. In this case, the plasma is formed between the plasma electrode 450 and the ground electrode by an electric field formed between the plasma electrode 450 and the ground electrode in accordance with the plasma power. Accordingly, the reactant gas (RG) supplied to the second gas distribution space 412*b* is activated by the plasma, and is locally distributed on the substrate (W).

Figure 16:
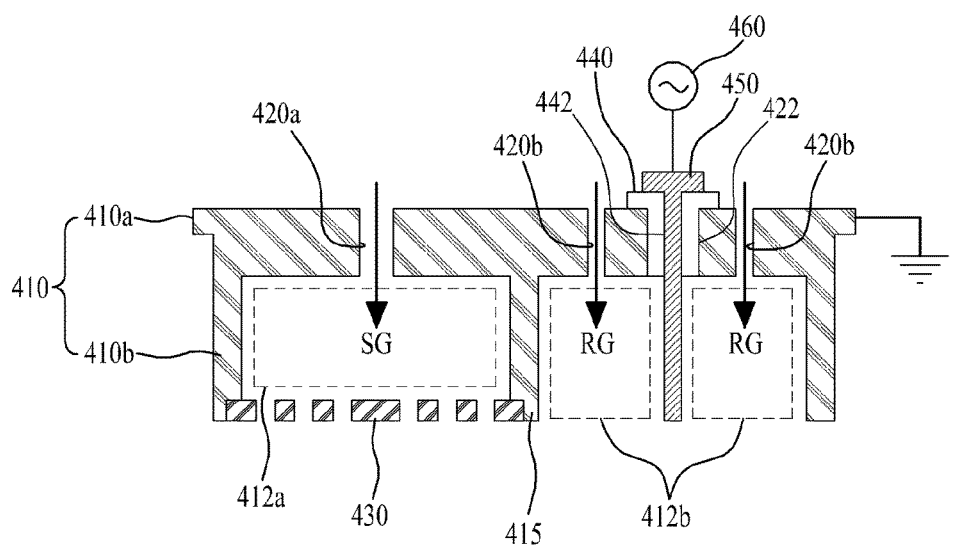
FIG. 16 is a cross sectional view illustrating a process gas distribution module according to the second modified embodiment in the substrate processing apparatus of the third embodiment of the present invention.

FIG. 16 is a cross sectional view illustrating the gas distribution module according to the second modified embodiment in the substrate processing apparatus of the third embodiment of the present invention, which is obtained by additionally forming a gas distribution pattern member 430 in the first gas distribution space 412*a* of the gas distribution module shown in FIG. 15. Hereinafter, only different structures will be described in detail.

The first and second gas distribution spaces 412*a* and 412*b* in each of the aforementioned first to third process gas distribution modules 342*a*, 342*b* and 342*c* are spatially separated by the use of ground partition 415. However, the activated reactant gas (RG) distributed to the second gas distribution space 412*b* may diffuse, flow backward and permeate into the first gas distribution space 412*a* which is positioned adjacent to the second gas distribution space 412*b*. In this case, the source gas (SG) reacts with the activated reactant gas (RG) inside the first gas distribution space 412*a*, whereby a thin film may be abnormally deposited on the inside wall of the first gas distribution space 412*a*, or an abnormal thin film of powder may be formed, and thus particles of the powder may fall down on the substrate (W).

The gas distribution pattern member 430 is provided at a lower side of a housing 410 so as to cover a lower side of the first gas distribution space 412*a*. The gas distribution pattern member 430 increases a distribution pressure of source gas (SG) supplied to the first gas distribution space 412*a* and downwardly distributed on the substrate (W), to thereby prevent the activated reactant gas (RG), which is distributed to the second gas distribution space 412*b* and is positioned close to the first gas distribution space 412*a* with the ground partition 415 interposed therebetween, from diffusing, flowing backward and permeating into the first gas distribution space 412*a*. The gas distribution pattern member 430 is identical in structure to the gas distribution pattern member 230 shown in FIG. 9, whereby a detailed explanation for the gas distribution pattern member 430 will be omitted.

Meanwhile, the aforementioned gas distribution pattern member 430 may be additionally provided at a lower side of the housing 410 so as to cover a lower side of the second gas distribution space 412*b*, whereby the reactant gas (RG) activated in the second gas distribution space 412*b* may be downwardly distributed at a predetermined pressure.

In the substrate processing apparatus according to the third embodiment of the present invention, which is provided with the process gas distribution module according to the second modified embodiment of the present invention, the source gas (SG) supplied to the first gas distribution space 412*a* is downwardly distributed at the predetermined pressure through the use of gas distribution pattern member 430, so that it is possible to prevent the abnormal thin film from being deposited on the inner sidewall of the first gas distribution space 412*a* by the activated reactant gas (RG) distributed from the second gas distribution space 412*b*.

Figure 17:
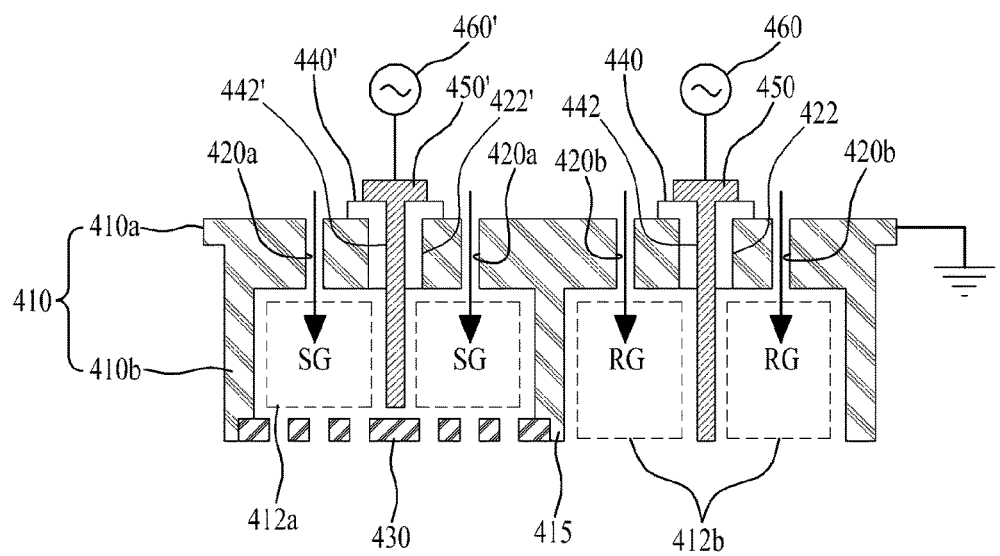
FIG. 17 is a cross sectional view illustrating a process gas distribution module according to the third modified embodiment in the substrate processing apparatus of the third embodiment of the present invention.

FIG. 17 is a cross sectional view illustrating the process gas distribution module according to the third modified embodiment in the substrate processing apparatus of the third embodiment of the present invention, which is obtained by additionally forming a plasma electrode 450' in the first gas distribution space 412*a* of the process gas distribution module shown in FIG. 16. Hereinafter, only different structures will be described in detail.

In the above substrate processing apparatus of the third embodiment of the present invention as well as the substrate processing apparatus of FIG. 16, the source gas (SG), which is to be distributed on the substrate (W), is not activated. However, there is a need to activate the source gas (SG) in accordance with the kind of thin film to be deposited on the substrate (W), and to distribute the activated source gas on the substrate (W). Accordingly, the process gas distribution module according to the third modified embodiment in the substrate processing apparatus according to the third embodiment of the present invention activates the source gas (SG), and distributes the activated source gas on the substrate (W).

Each of first to third process gas distribution modules 342*a*, 342*b* and 342*c* according to the third modified embodiment of the present invention may further include the plasma electrode 450' which is inserted into the first gas distribution space 412*a*. To this end, a ground plate 410*a* of a housing 410 is provided with an insulating member insertion hole 422' being communicated with the first gas distribution space 412a, and an insulating member 440' is inserted into the insulating member insertion hole 422'. Also, the insulating member 440' is provided with an electrode insertion hole 442' being communicated with the first gas distribution space 412b, and the plasma electrode 450' is inserted into the electrode insertion hole 442'.

The plasma electrode 450' is inserted into the first gas distribution space 412a, and is arranged in parallel to a ground sidewall 410b. In this case, a lower surface of the plasma electrode 450' is provided at a predetermined interval from an upper surface of the gas distribution pattern member 430, and is inserted into the electrode insertion hole 442', whereby the lower surface of the plasma electrode 450' is positioned in the first gas distribution space 412a.

The plasma electrode 450' forms plasma by the use of source gas (SG) supplied to the first gas distribution space 412a in accordance with plasma power supplied from a plasma power supplier 460'. In this case, the plasma is formed between the plasma electrode 450' and the ground electrode by an electric field formed between the plasma electrode 450' and the ground electrode in accordance with the plasma power. Accordingly, the source gas (SG) supplied to the first gas distribution space 412a is activated by the plasma, and is locally distributed on the substrate (W).

The plasma electrode 450 arranged in the first gas distribution space 412a and the plasma electrode 450' arranged in the second gas distribution space 412b may be supplied with the same plasma power or the different plasma powers from one plasma power supplier or the different plasma power suppliers 460 and 460'.

In the above substrate processing apparatus and method according to the embodiments of the present invention, the gas distributor includes four gas distribution modules for distributing the source gas (SG), the reactant gas (RG) and the surface treatment gas (TG), but not limited to this structure. For example, the gas distributor may include three or more gas distribution modules for individually distributing the source gas (SG), the reactant gas (RG) and the surface treatment gas (TG), or may include two or more process gas distribution modules for distributing the source gas (SG) and the reactant gas (RG), and one or more surface treatment gas distribution module for distributing the surface treatment gas (TG).

Figure 18:
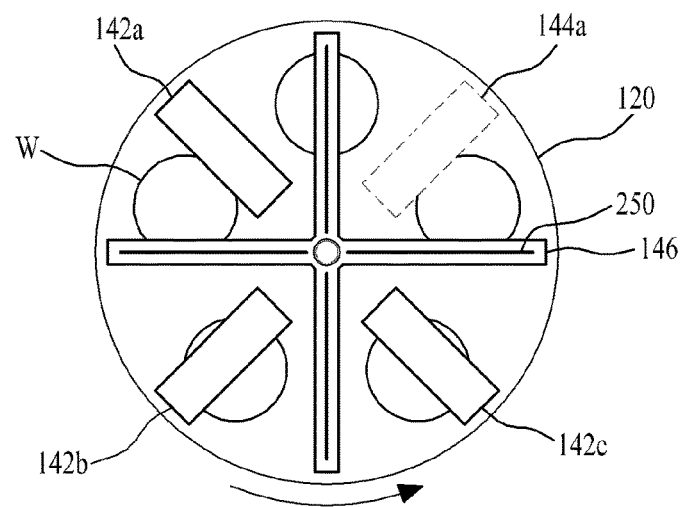
FIG. 18 is a concept view illustrating an arrangement structure of a gas distributor in a substrate processing apparatus according to the fourth embodiment of the present invention.

FIG. 18 is a concept view illustrating an arrangement structure of gas distributor in a substrate processing apparatus according to the fourth embodiment of the present invention, which is obtained by modifying a structure of purge gas distribution module shown in FIG. 6 and FIG. 7. Hereinafter, only different structures will be described in detail.

In the above embodiments of the present invention shown in FIG. 6 to FIG. 17, the purge gas, which is not activated, is distributed to the purge gas distribution area defined in-between each of first to fourth gas distribution areas 120a, 120b, 120c and 120d. However, the purge gas may be activated by the use of plasma, and the activated purge gas may be distributed to the purge gas distribution area (See '120e' of FIG. 6).

In detail, a purge gas distribution module 146 of the substrate processing apparatus according to the fourth embodiment of the present invention includes a housing 210 functioning as a ground electrode, and a plasma electrode 250 inserted into the inside of the housing 210, which is identical in structure to that of the gas distribution module shown in FIG. 10, whereby a detailed explanation for the same structure will be omitted.

Accordingly, the substrate processing apparatus and method according to the fourth embodiment of the present invention forms plasma in the purge gas distribution module 146, and distributes the purge gas, which is activated by the plasma, on the substrate (W) so that it is possible to simultaneously perform a purge process and a surface treatment process by the use of activated purge gas, thereby increasing a density of thin film deposited on the substrate (W). Especially, if using the purge gas of argon (Ar) or helium (He), the substrate processing apparatus and method according to the fourth embodiment of the present invention increases a density of thin film deposited on the substrate (W), and thus lowers an etching ratio of thin film when patterning the thin film.

The substrate processing apparatus according to the fourth embodiment of the present invention simultaneously performs the purge process and the surface treatment process by distributing the activated purge gas through the use of purge gas distribution module 146, whereby the activated purge gas distributed from the purge gas distribution module 146, which functions as the activated surface treatment gas, is distributed on the substrate (W). Accordingly, the purge gas distribution module 146 functions as the above surface treatment gas distribution module 144a, that is, the surface treatment gas distribution module 144a is substituted by the purge gas distribution module 146, so that it is possible to omit the above surface treatment gas distribution module 144a.

Figure 19:
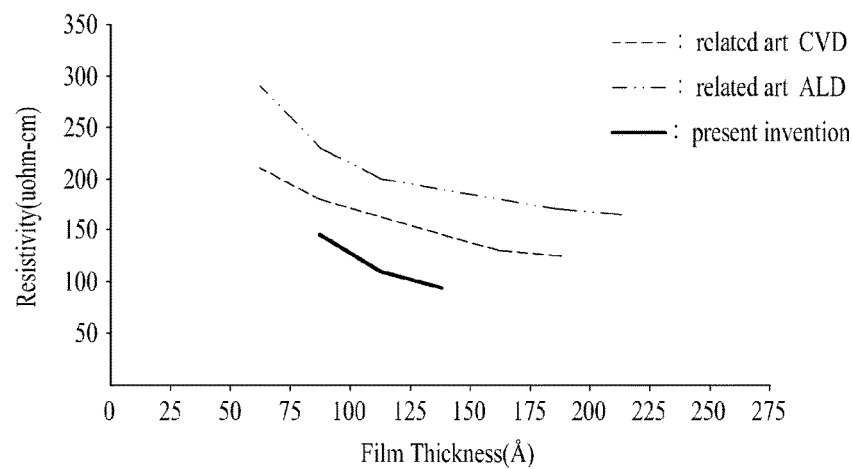
FIG. 19 is a graph of comparing resistivity in accordance with the thickness of thin film formed by the substrate processing apparatus according to the present invention with resistivity in accordance with the thickness of thin film formed by the related art CVD process and the ALD process.

FIG. 19 is a graph of comparing resistivity in accordance with the thickness of thin film formed by the substrate processing apparatus according to the present invention with resistivity in accordance with the thickness of thin film formed by the related art CVD process and the ALD process.

As shown in FIG. 19, under conditions that the resistivity is measured at the same thickness of the thin film, the resistivity of thin film deposited on the substrate (W) by the substrate processing apparatus and method according to the present invention is lower than the resistivity of thin film deposited by the related art CVD process or ALD process.

Figure 20:
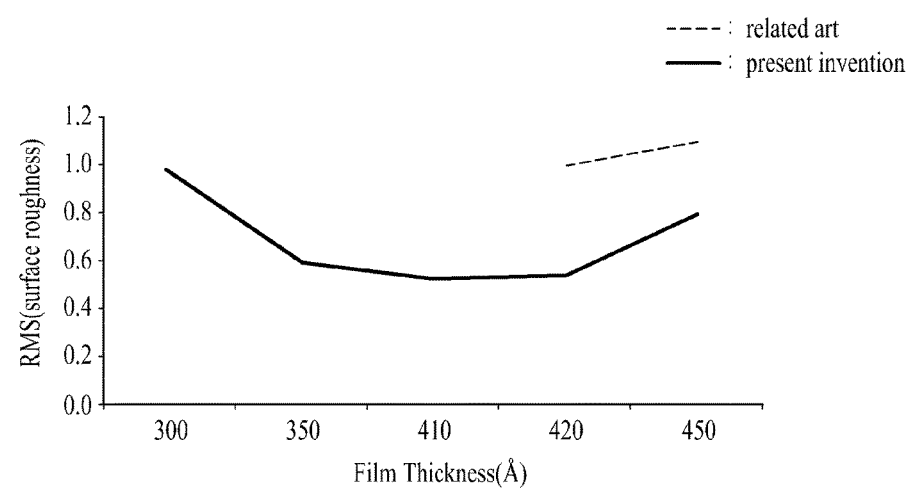
FIG. 20 is a graph of comparing surface roughness in accordance with the thickness of thin film formed by the substrate processing method of the present invention with surface roughness in accordance with the thickness of thin film formed by the related art substrate processing method.

FIG. 20 is a graph of comparing surface roughness in accordance with the thickness of thin film formed by the substrate processing method of the present invention with surface roughness in accordance with the thickness of thin film formed by the related art substrate processing method.

As shown in FIG. 20, the surface roughness of thin film deposited on the substrate (W) by the substrate processing apparatus and method according to the present invention is relatively less than the surface roughness of thin film deposited on the substrate (W) by the substrate processing apparatus and method according to the related art.

According to the substrate processing apparatus and method of the present invention, the thin film deposition process and the surface treatment process for removing the foreign matters from the thin film deposited on the substrate (W) are sequentially or cyclically performed inside the process space of the process chamber, thereby improving the quality and density of thin film deposited on the substrate (W).

Especially, the surface treatment process is performed in a short time after the thin film is deposited on the substrate (W) so that the surface treatment gas (TG) permeates into the deep inside of the thin film, thereby improving the surface treatment efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing apparatus comprising:
    a process chamber for providing a process space;
    a substrate supporter for supporting at least one substrate and moving the supported substrate in a predetermined direction, wherein the substrate supporter is provided inside the process chamber;
    a chamber lid confronting the substrate supporter, the chamber lid covering an upper side of the process chamber; and
    a gas distributor provided in the chamber lid;
        wherein the gas distributor includes a plurality of modules to locally distribute process gas toward the substrate supporter;
        modules are provided at fixed intervals in the chamber lid and are each laterally separated from each other; and
        wherein each module includes a housing having a ground plate extending horizontally and that is electrically grounded through the chamber lid, a ground sidewall that extends integrally and vertically downward from the ground plate, and a first gas supplying hole extending vertically through the ground plate to provide communication with a first external source of gas and a first gas distribution space defined by the ground plate and the ground sidewall; and
        a partition member that extends integrally and vertically downward from the ground plate and a second gas supplying hole extending vertically through the ground plate to provide additional communication with a second external source of gas and a second gas distribution space defined by the ground plate, the ground sidewall and the partition member.

2. The apparatus of claim 1, wherein the ground sidewall extends from a lower surface of the ground plate and the ground plate extends horizontally beyond the ground sidewall.

3. The apparatus of claim 1,
    wherein the housing of at least any one of the plurality of modules includes a plasma electrode arranged in parallel with respect to the ground sidewall; and
    wherein the plasma electrode and the ground sidewall are provided at a predetermined interval from an upper surface of the substrate supporter.

4. The apparatus of claim 3, wherein the ground sidewall and the plasma electrode, for at least one of the plurality of modules, are perpendicular with respect to the substrate supporter.

5. The apparatus of claim 1, wherein the plurality of modules include a source gas distribution module and a reactant gas distribution module, and wherein at least any one of the source gas distribution module and the reactant gas distribution module includes a plasma electrode arranged in parallel with the ground sidewall of the housing, wherein the plasma electrode and the ground sidewall are provided at a predetermined interval from an upper surface of the substrate, and an interval between the ground sidewall and plasma electrode is smaller than an interval between the plasma electrode and the substrate.

* * * * *